United States Patent
Kelly et al.

(10) Patent No.: US 7,138,955 B2
(45) Date of Patent: Nov. 21, 2006

(54) ROBUST ANTENNA CONNECTION FOR AN ELECTRONICS COMPONENT ASSEMBLY IN A TIRE

(75) Inventors: Charles E. Kelly, Little River, SC (US); Cameron E. Smith, Greenville, SC (US)

(73) Assignee: Michelin Recherche et Technique S.A. (CH)

( * ) Notice: Subject to any disclaimer, the term of this patent is extended or adjusted under 35 U.S.C. 154(b) by 93 days.

(21) Appl. No.: 10/692,237

(22) Filed: Oct. 23, 2003

(65) Prior Publication Data
US 2005/0088361 A1    Apr. 28, 2005

(51) Int. Cl.
*H01Q 1/36*    (2006.01)
(52) U.S. Cl. .................................................. 343/806
(58) Field of Classification Search ............... 343/793, 343/806, 895; 340/445; 156/110.01, 112, 156/114
See application file for complete search history.

(56) References Cited

U.S. PATENT DOCUMENTS

| | | | |
|---|---|---|---|
| 4,911,217 A | 3/1990 | Dunn et al. | |
| 5,448,110 A | 9/1995 | Tuttle et al. | |
| 5,960,844 A * | 10/1999 | Hamaya | 152/152.1 |
| 6,078,791 A | 6/2000 | Tuttle et al. | |
| 6,121,880 A | 9/2000 | Scott et al. | |
| 6,217,683 B1 * | 4/2001 | Balzer et al. | 156/60 |
| 6,443,198 B1 * | 9/2002 | Koch et al. | 152/152.1 |
| 6,444,069 B1 * | 9/2002 | Koch et al. | 156/123 |
| 6,462,650 B1 * | 10/2002 | Balzer et al. | 156/60 |
| 6,474,380 B1 * | 11/2002 | Rensel et al. | 152/152.1 |
| 6,582,363 B1 * | 6/2003 | Adachi et al. | 600/178 |
| 6,688,353 B1 * | 2/2004 | Koch | 152/152.1 |
| 6,705,365 B1 * | 3/2004 | Wilson | 156/110.1 |
| 6,772,505 B1 * | 8/2004 | Logan et al. | 29/600 |
| 6,853,347 B1 * | 2/2005 | Forster et al. | 343/806 |
| 2004/0164558 A1 * | 8/2004 | Adamson et al. | 290/1 R |
| 2005/0076992 A1 * | 4/2005 | Metcalf et al. | 156/110.1 |

OTHER PUBLICATIONS

U.S. Appl. No. 10/210,189, filed Jul. 31, 2002.
U.S. Appl. No. 10/793,368, filed Mar. 4, 2004.

* cited by examiner

*Primary Examiner*—Tuyet Vo
*Assistant Examiner*—Minh Dieu A
(74) *Attorney, Agent, or Firm*—Dority & Manning PA

(57) ABSTRACT

An electronics component assembly is provided. The assembly includes a tire along with a mounting member that may include means for securing an antenna incorporated in the tire. At least a first antenna wire is present and is incorporated in the tire and connected to the mounting member. Additionally, an integrated circuit is carried by the mounting member and is in communication with the first antenna wire. Additional embodiments are provided in which the mounting member may instead have a first retaining connection that is at least partially curved in shape.

45 Claims, 12 Drawing Sheets

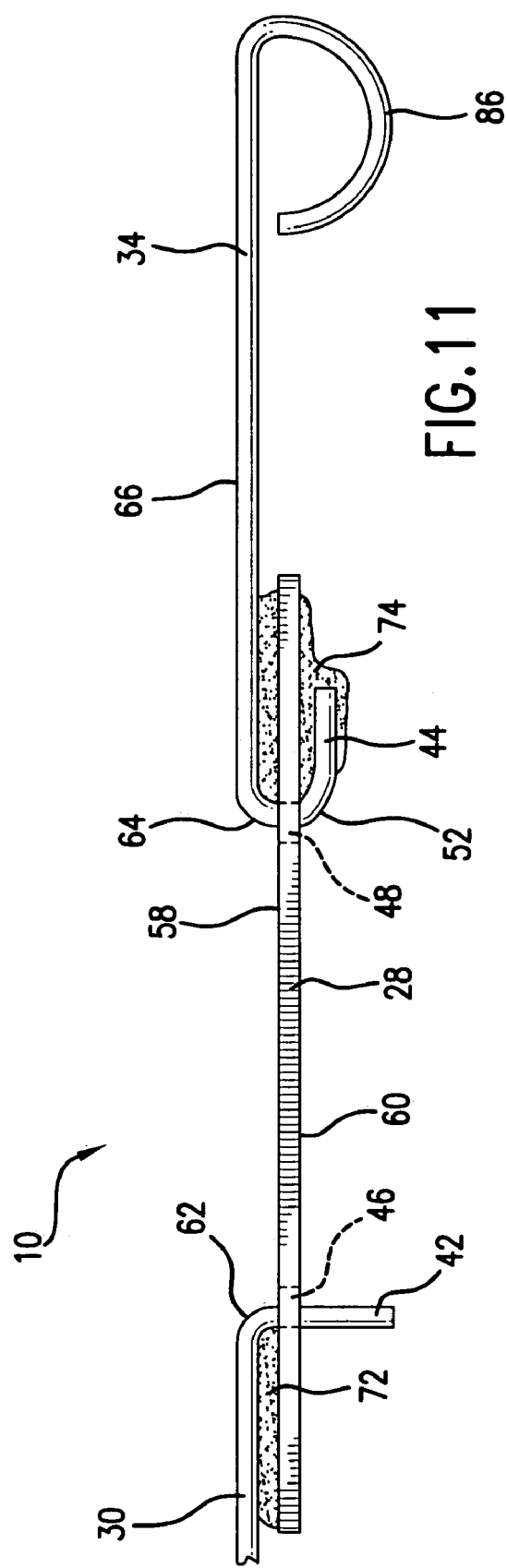
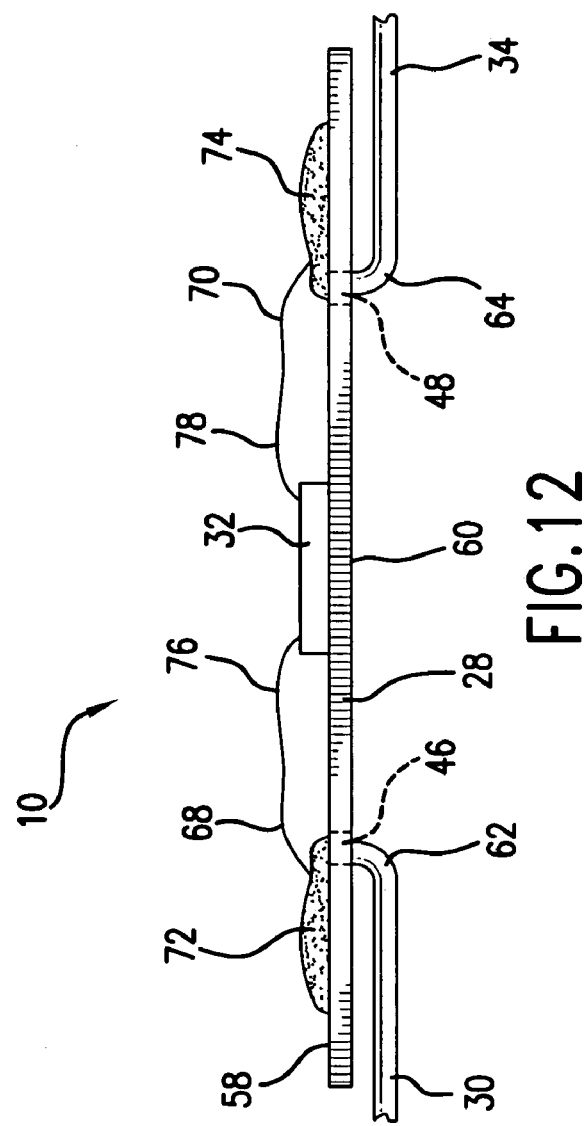

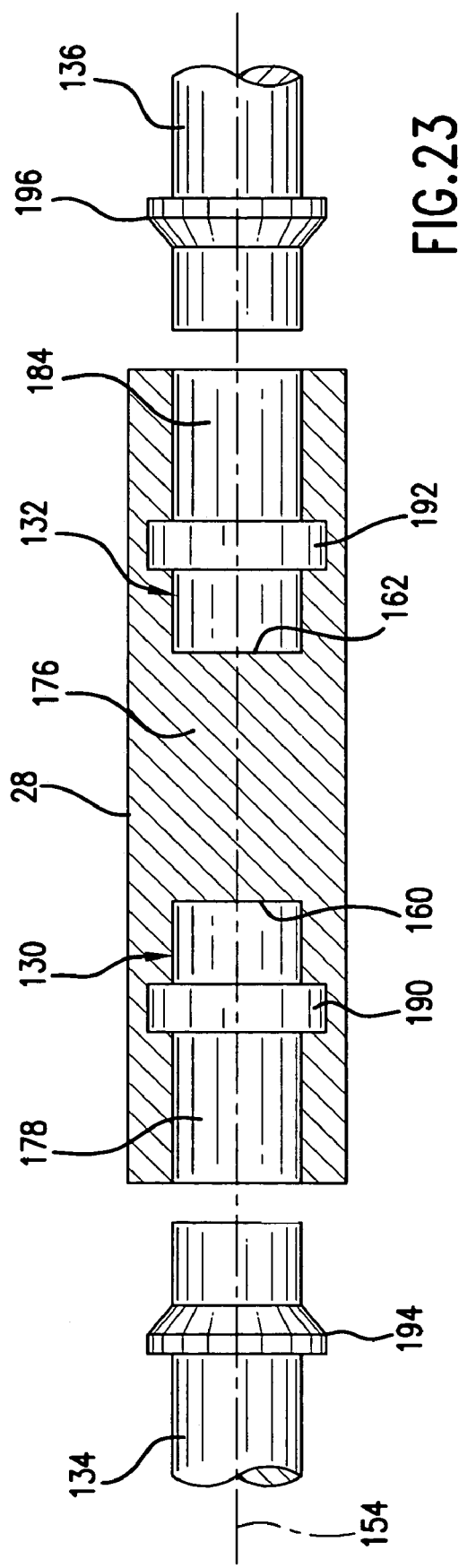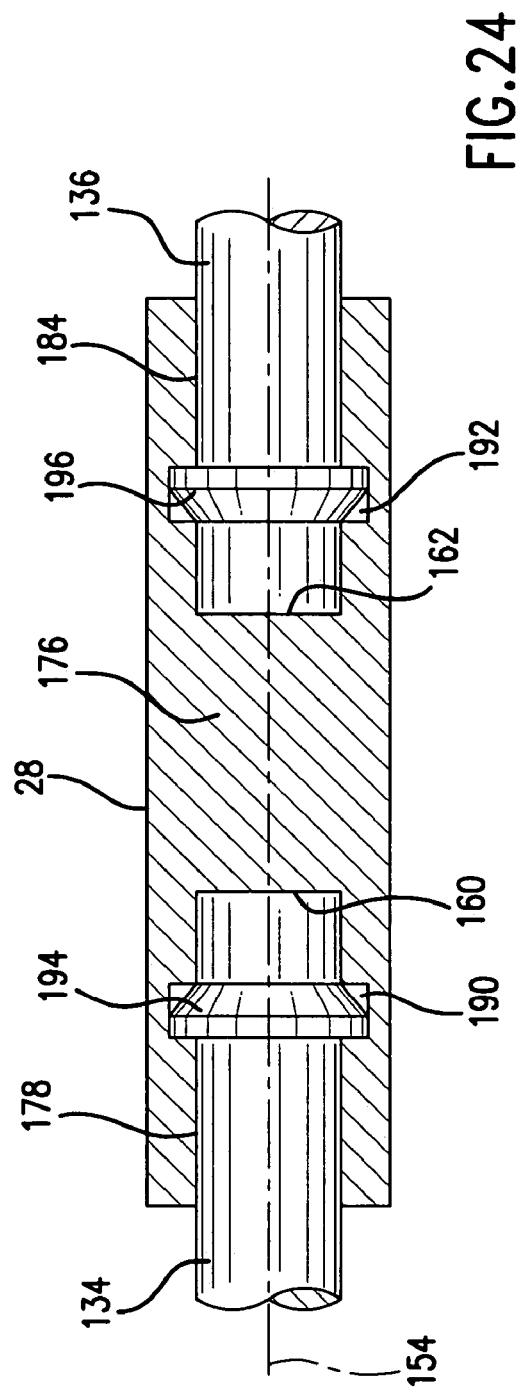

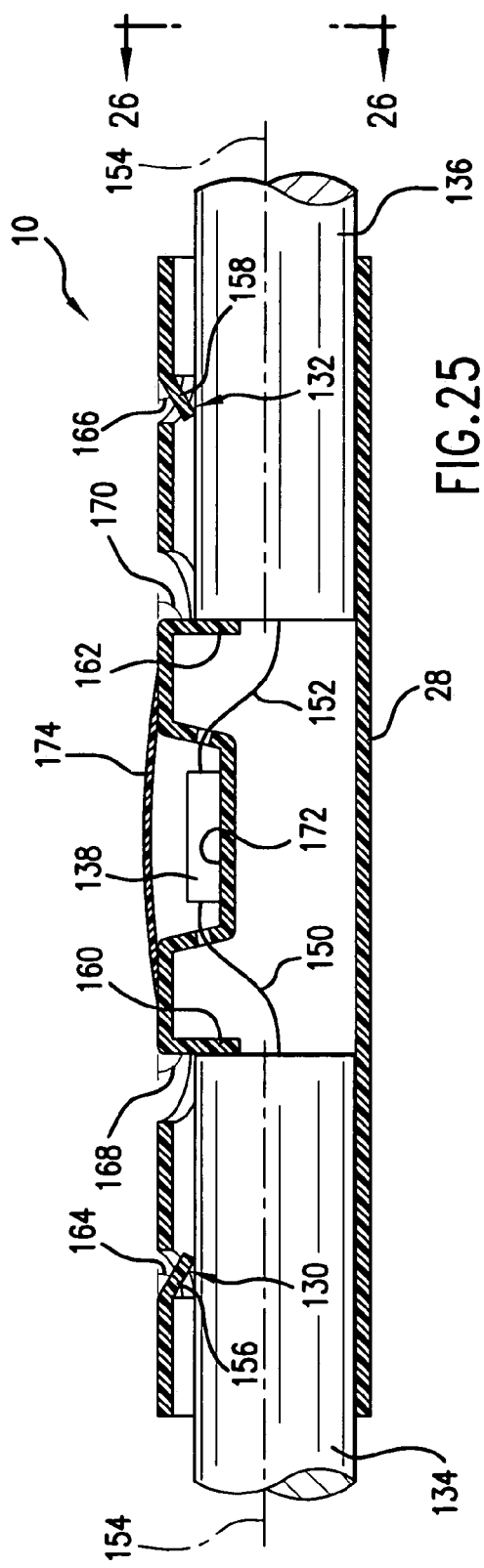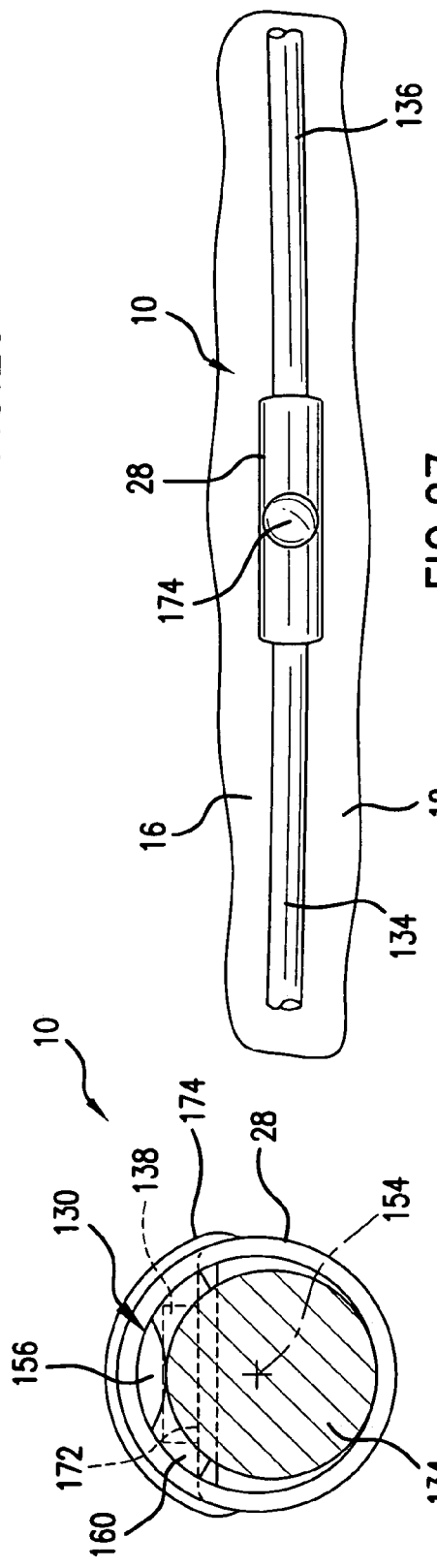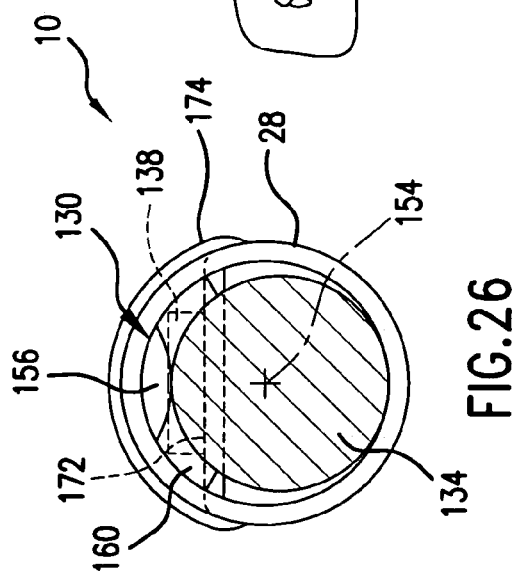

ROBUST ANTENNA CONNECTION FOR AN ELECTRONICS COMPONENT ASSEMBLY IN A TIRE

TECHNICAL FIELD

The present invention relates generally to electronic apparatuses for tires. More particularly, the present invention relates to a robust antenna connection used in an electronics component assembly mounted inside of a tire and used for communicating information to or from the tire.

BACKGROUND

Systems are known to monitor the physical properties of a tire on a vehicle such as the temperature, pressure, and the road surface in contact with the tire. One way of monitoring the physical properties of a tire includes the use of an electrical component mounted on or within the tire. In addition, electronic systems are also used to carry information about the tire, for example identification information, and communicate the information by wireless means.

The electrical component may be mounted inside of the tire to monitor one or more physical properties of the tire and then report these properties to a remote location. In order to aid in communication to and from this remote location, the electrical component may be fitted with one or more antennas. The tire is not a rigid object, but one which is at least partially flexible. The tire may flex during the building process of the tire and through normal use such as driving. As such, the electrical component and the antennas will be connected to a surface that flexes. This flexing can cause tension and other forces to be imparted upon the electrical component and the antennas, resulting in the electrical component being separated from the antennas. Obviously, such a result is undesirable. It is sometimes the case that the antennas are connected directly to an integrated circuit in the electronics component assembly and retained thereon through this connection.

An example of electronics incorporated into a tire may be found in U.S. patent application Ser. No. 10/210,189 entitled "Electronics Component Assembly in a Tire" filed Jul. 31, 2002 having inventors Charles Edward Kelly, George Phillips O'Brien, and Edwin Dwane Parsons. U.S. patent application Ser. No. 10/210,189 is owned by the assignee of the present application and is incorporated herein by reference in its entirety for all purposes.

The present invention improves upon previous electrical components that have been integrated with tires to monitor physical properties of the tire or to provide other information transfer. The present invention provides for a more robust connection between the antennas and the electrical component used to monitor the tire such that these members will not become disengaged or break upon flexing of the tire.

SUMMARY

Various features and advantages of the invention will be set forth in part in the following description, or may be obvious from the description, or may be learned through practice of the invention.

The present invention provides for an electronics component assembly in a tire that has a robust antenna connection. The invention includes a tire and a mounting member that is incorporated in the tire and includes means for securing an antenna thereto. Also provided is at least a first antenna wire, although it is to be understood that any number of antenna wires may be incorporated in various exemplary embodiments of the present invention. The first antenna wire may be connected to the mounting member. Further, an integrated circuit is provided and is carried by the mounting member. The integrated circuit and the first antenna wire are placed into communication with one another. The first antenna wire is retained in the electronics component assembly through a connection with the mounting member, as opposed to being directly attached to the integrated circuit.

The present invention also includes an exemplary embodiment of an electronics component assembly that has a tire and a mounting member incorporated in the tire. The mounting member may have a first and a second side that are opposite from one another. Also, a first and second antenna wire may be included. The first and second antenna wires may be securely attached to the mounting member and incorporated in the tire. Further, an integrated circuit may be carried by the mounting member. Additionally, a first communication connection may be provided and may be configured for placing the first antenna wire into communication with the integrated circuit. Likewise, a second communication connection may be present and may be configured for placing the second antenna wire into communication with the integrated circuit.

The mounting member may be a small outline package, or may be a printed circuit board in accordance with other exemplary embodiments of the present invention.

The mounting member may have a first and second retaining groove into which the first and second antenna wires may, respectively, be at least partially retained. Further, the first and second retaining groove may be perpendicular to a longitudinal axis of the mounting member.

Another exemplary embodiment of the present invention exists where a length of the end of the first antenna wire is connected to the mounting member and is oriented in a direction perpendicular to the longitudinal axis of the mounting member. Similarly, the second antenna wire may be arranged in a like fashion. Alternatively, the wires may be parallel to the longitudinal axis.

The present invention also provides for other exemplary embodiments of the electronics component assembly where the first antenna wire may be connected to the mounting member by various connections. For instance, the mounting member may have a first antenna wire receiving aperture, and the first antenna wire may be hooked shaped and may be received by the first antenna wire receiving aperture. Likewise, a second antenna wire receiving aperture may be provided for receipt of a hooked shaped end of the second antenna wire. The ends of the first and second antenna wire may extend through the mounting member, or alternatively may be flush with one side of the mounting member in accordance with other exemplary embodiments of the present invention.

The present invention provides for exemplary embodiments where the antenna wires may be connected to the mounting member in a variety of manners. For instance, the antenna wires may be connected to the mounting member by way of soldering, welding, and/or crimping.

Additionally, the present invention also provides for various exemplary embodiments where the antennas may be placed into communication with the integrated circuit in a variety of manners. For instance, in accordance with one exemplary embodiment of the present invention a first mounting member wire may be connected to the first antenna wire and the integrated circuit for providing for such communication. Additionally, a second mounting member wire may be incorporated in a similar fashion in order to place the second antenna wire into communication with the integrated circuit. Alternatively or additionally, the antenna wires may be bonded to the integrated circuit and may be placed into communication with the integrated circuit through the bonded connection or connections. In accordance with one exemplary embodiment of the present invention, the bonded connections may be a soldered connection.

The present invention also provides for an exemplary embodiment that has a partially curved antenna connection. This embodiment includes a mounting member that may be incorporated in a tire. The mounting member has a first retaining connection that is at least partially curved in shape. Also provided is at least a first antenna wire, although it is to be understood that any number of antenna wires may be incorporated in various exemplary embodiments of the present invention. The first antenna wire may be connected to the first retaining connection. Further, an integrated circuit is provided and is carried by the mounting member. The integrated circuit and the first antenna wire are placed into electrical communication with one another. The first antenna wire is retained in the electronics component assembly through a connection with the mounting member, as opposed to being directly attached to the integrated circuit.

Also provided in the present invention is an electronics component assembly as previously discussed which further has a second antenna wire incorporated in the tire and connected to a second retaining connection on the mounting member. The second retaining connection may also be at least partially curved in shape.

Also provided in accordance with the present invention is an electronics component assembly in a tire as previously discussed where instead of being at least partially curved in shape, the first and second retaining connections are at least partially cylindrical in shape.

BRIEF DESCRIPTION OF THE DRAWINGS

FIG. 11 is an elevation view of an exemplary embodiment of an electronics component assembly in accordance with the present invention. A pair of antenna wires are shown connected to the mounting member which is a printed circuit board.

FIG. 12 is an elevation view of an exemplary embodiment of an electronics component assembly in accordance with the present invention. A pair of antenna wires is shown connected to the mounting member. A first and second mounting member wire are shown placing the first and second antenna wires into communication with the integrated circuit.

FIG. 23 is a cross-sectional elevation view of a mounting member in accordance with one exemplary embodiment of the present invention. The mounting member is in the shape of a generally solid cylinder with first and second retaining connections each having an annular recess.

FIG. 24 shows the mounting member of FIG. 23 with a first and second antenna wire that each have an annular projection thereon. The annular projections of the first, and second antenna wires are received by the annular recesses of the first and second retaining connections.

FIG. 25 is a partial cross-sectional elevation view of an exemplary embodiment of an electronics component assembly in accordance with the present invention. The mounting member is generally tubular in shape and has a flat portion onto which the integrated circuit is mounted.

FIG. 26 is a front elevation view taken along line 26—26 of FIG. 25.

FIG. 27 is a top plan view of an electronics component assembly in accordance with one exemplary embodiment of the present invention. The electronics component assembly is shown located on the inner surface of the tire and has a cover that surrounds and protects various components of the electronics component assembly.

DETAILED DESCRIPTION

Figure 1:
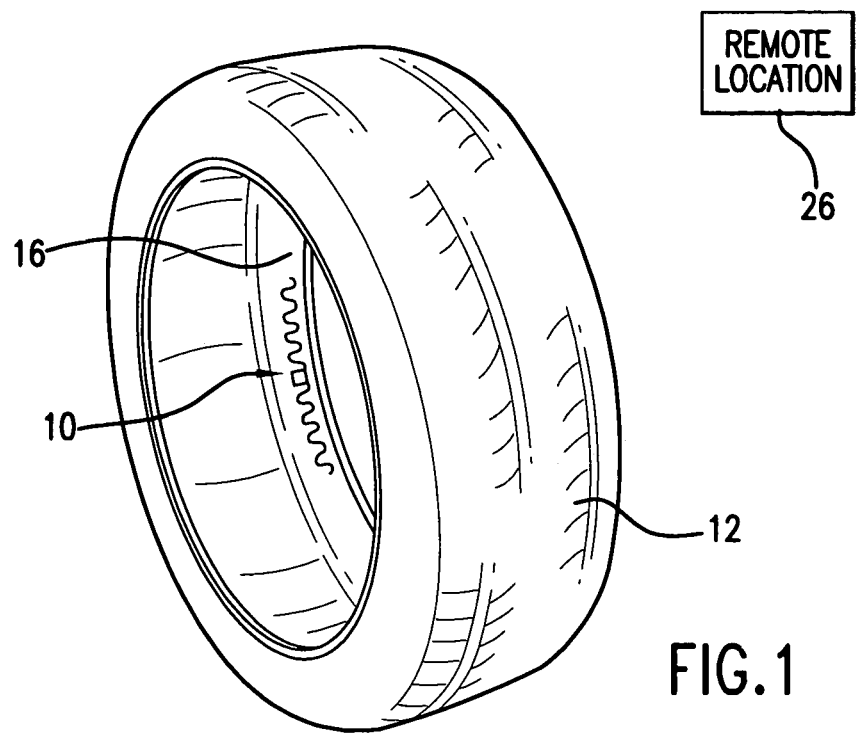
FIG. 1 is a perspective view of a tire. An electronics component assembly is shown located on an inner surface of the tire.

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

Figure 5:
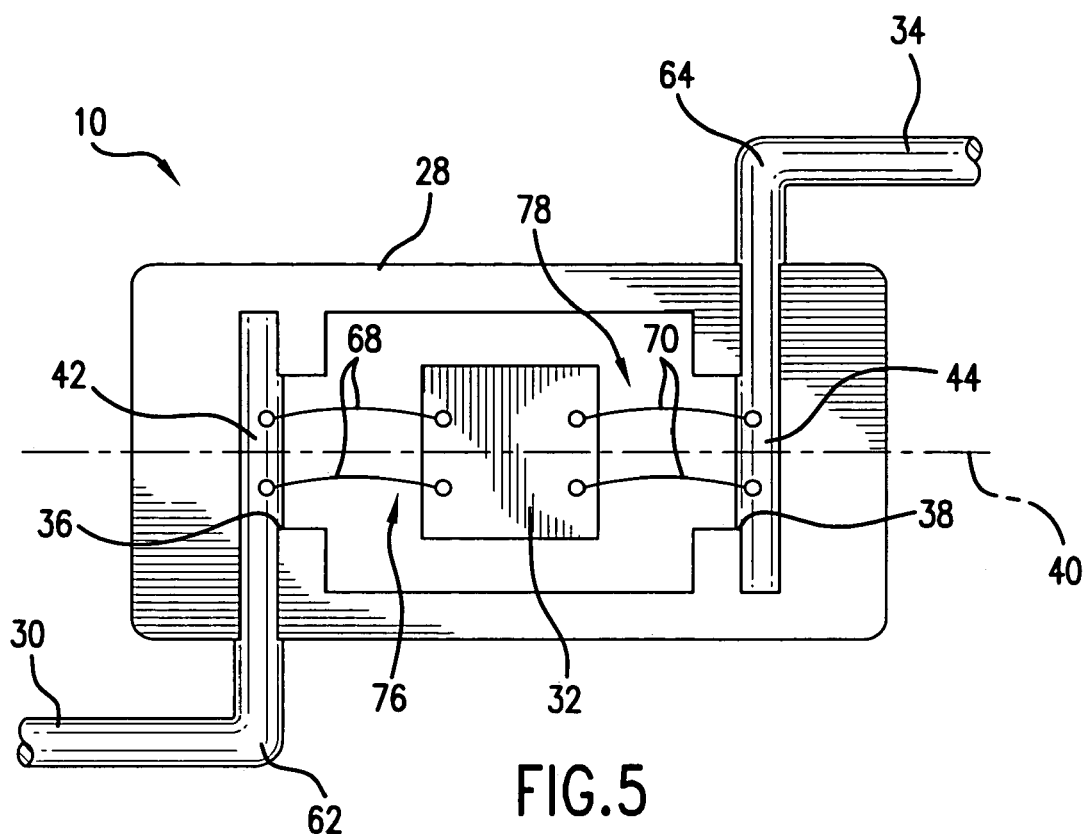
FIG. 5 is a plan view of an exemplary embodiment of an electronics component assembly in accordance with the present invention. Here, an integrated circuit is carried by a mounting member that is a small outline package and is connected to two antennas through a first and second communication connection.

The present invention makes use of an electronics component assembly 10 as shown, in one exemplary embodiment, in FIG. 5. The embodiment shown in FIG. 5 includes an integrated circuit 32 with a first and second antenna wire 30 and 34. The antenna wires 30, 34 are connected to a mounting member 28 and are not directly connected to the integrated circuit 32. This arrangement provides for a more robust connection due to the fact that a stronger physical connection may be made between the first and second antenna wires 30, 34 and the mounting member 28 as opposed to a connection between the first and second antenna wires 30, 34 and the integrated circuit 32. The first and second antenna wires 30, 34 may further be placed into communication with the integrated circuit 32 through a first and second communication connection 76, 78 as shown in FIG. 5.

Referring now to FIG. 1, the electronics component assembly 10 is shown incorporated into a tire 12. This incorporation offers the advantages of asset tracking (e.g. tire identification) and measurement of physical properties such as temperature and pressure. The electronics component assembly 10 may be a wireless data link that is capable of communicating with a remote location 26 outside of the vehicle. For instance, the electronics component assembly 10 may communicate with a drive-by interrogator or with a hand-held interrogator. Additionally, the electronics component assembly 10 may also communicate with a device onboard the vehicle, for instance an onboard computer which is in effect the remote location 26.

FIG. 1 shows the electronics component assembly 10 connected to an inner surface 16 of the tire 12. The electronics component assembly 10 may store identification and/or information and may be capable of measuring physical properties of the tire 12 during both operational and non-operational states. For instance, the electronics component assembly 10 may monitor the pressure of the tire 12 in certain exemplary embodiments. In other exemplary embodiments, the temperature of the tire 12 may be measured by the electronics component assembly 10. This information may be sent to the remote location 26 by the electronics component assembly 10 so that a driver may monitor the pressure and/or temperature of the tire 12. The present invention encompasses exemplary embodiments where information from the electronics component assembly 10 is sent to a variety of locations.

Figure 2:
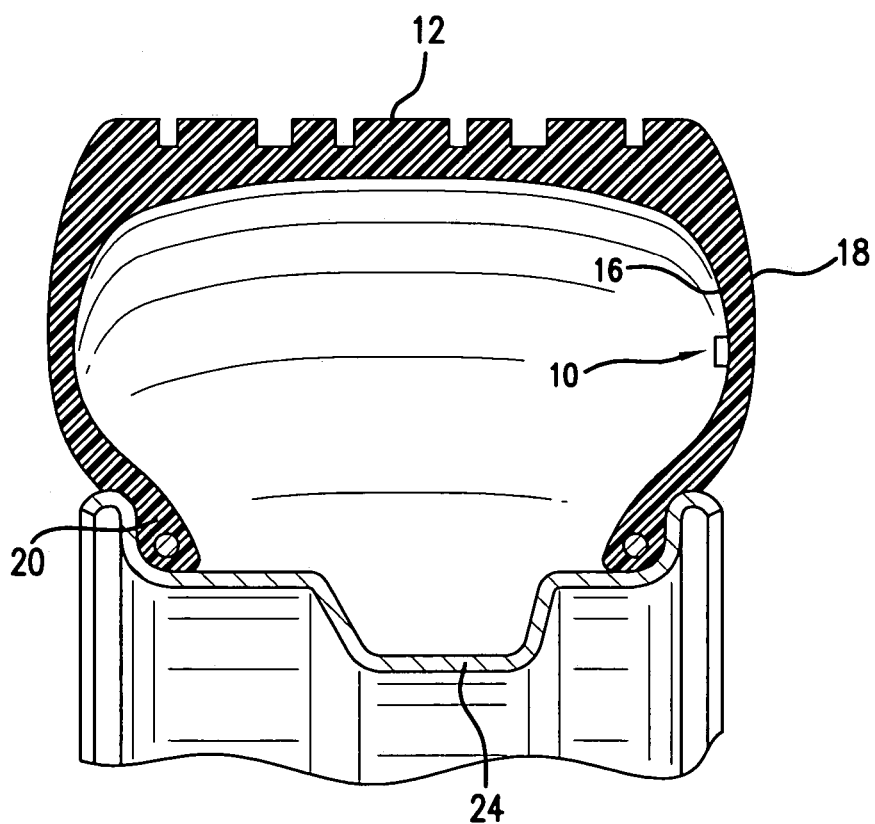
FIG. 2 is a partial cross-sectional view of a tire assembly. The view shows an electronics component assembly located on an inner surface of the tire proximate to a bead of the tire.

A cross sectional view of the tire 12 placed onto a rim 24 is shown in FIG. 2. The tire 12 has a pair of beads 20 which rest on the rim 24. The tire 12 has a pair of side walls 18 which extend from the beads 20 up into the tread portion of the tire 12. The electronics component assembly 10 of the present invention may be incorporated in the tire 12 structure, and may in one exemplary embodiment be affixed to the inner surface 16 of the side wall 18. Additionally, the electronics component assembly 10 may be located on or in other portions of the tire 12, for instance integrated or embedded into the side wall 18 as opposed to being on the inner surface 16 of the side wall 18.

In one exemplary embodiment of the present invention, it is desirable to have the electronics component assembly 10 incorporated in the side wall 18 as close to the axis of rotation of the rim 24 and tire 12 assembly as possible. This is because during normal use, the portion near the bead 20 experiences the least amount of flexure. To the contrary, the portion of the tire 12 near the tread will flex more due to the load response of the tire 12 and through normal driving forces imparted on the tire 12. As such, the tread portion of tire 12 and the side wall 18 of the tire 12 near the tread portion will exhibit an increased amount of flexing during normal operations of the tire 12. Locating the electronics component assembly 10 on a portion of the tire 12 that exhibits an increased amount of flexing will result in an increased amount of tension being applied to the electronics component assembly 10.

It may therefore be desirable to move the electronics component assembly 10 as far away from the flexing portions of the tire 12 as possible. However, problems may occur if the electronics component assembly 10 is placed too close to the rim 24. This is because the rim 24 may be made of a material that impedes the transmission of signals from the electronics component assembly 10 to the remote location 26 (FIG. 1). Preferably, the electronics component assembly 10 is placed a small distance from the bead 20. However, it is to be understood that the present invention encompasses various exemplary embodiments of the electronics component assembly 10 placed at a variety of locations within the tire 12 and rim 24 assembly. As such, the present invention encompasses other exemplary embodiments where the location of the electronics component assembly 10 is placed at other points besides the ones shown in FIGS. 1 and 2.

The electronics component assembly 10 is shown attached to the inner surface 16 of the side wall 18 of the tire 12 in FIGS. 1 and 2. In other exemplary embodiments, the electronics component assembly 10 may not be on the inner surface 16, but actually embedded into the side wall 18. Such a placement may be realized during the construction of the tire 12. During the normal build process of the tire 12, flexing may occur. Therefore, it is possible that the electronics component assembly 10 may be damaged during the normal build process of the tire 12 in addition to, or alternatively to, normal use of the tire 12 once built.

Figure 3:
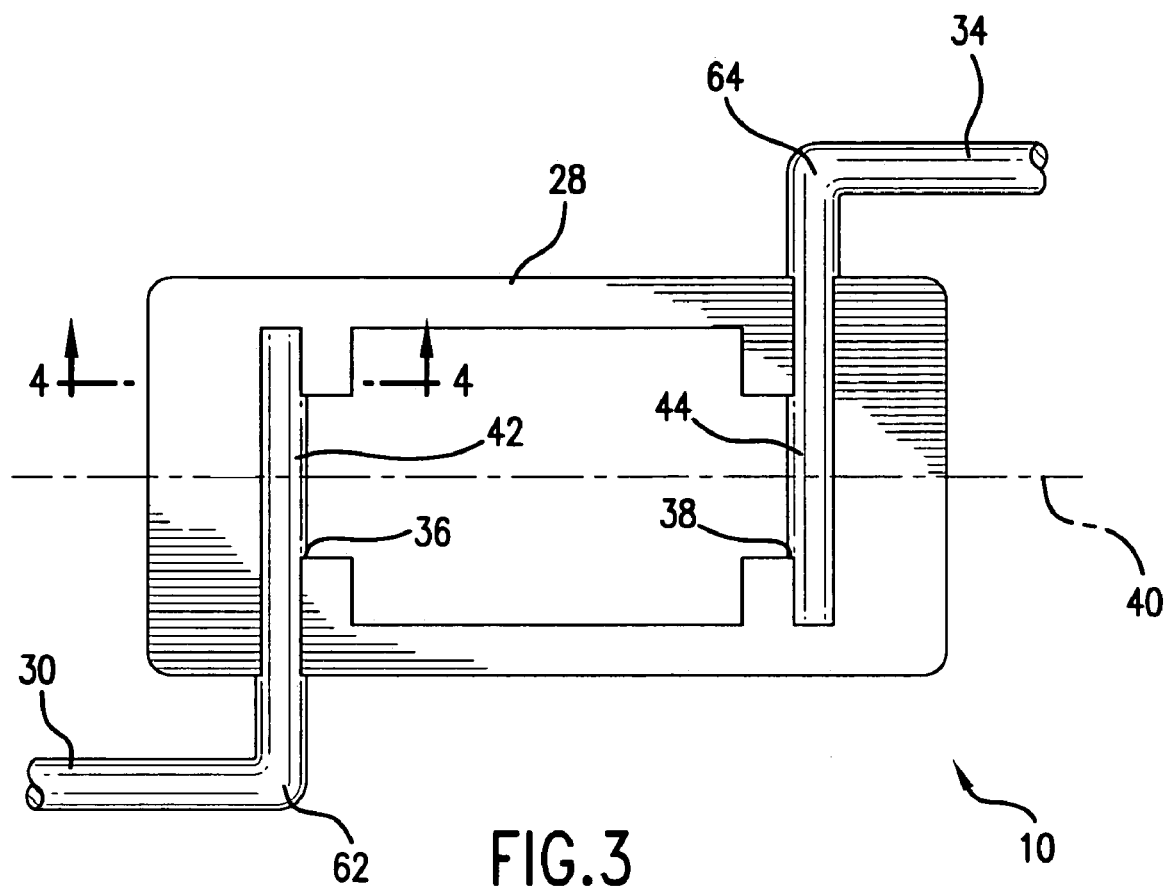
FIG. 3 is a plan view of an exemplary embodiment of an electronics component assembly in accordance with the present invention. Here, a pair of antennas is shown as being retained by a mounting member that is a small outlined package.

A mounting member 28 used in an exemplary embodiment of the electronics component assembly 10 is shown in FIG. 3. Here, the mounting member 28 is a small outline package (SOP). As used in the specification and claims, the term small outline package (SOP) is to be understood as also including a mini small outline package (MSOP). The mounting member 28 is provided with a first retaining groove 36 and a second retaining groove 38. The first antenna wire 30 may be provided with a bend 62 and an end 42. The end 42 of the first antenna wire 30 may be received by the first retaining groove 36. Likewise, the second antenna wire 34 may be provided with a bend 64 and an end 44. Similarly, the end 44 of the second antenna wire 34 may be received by the second retaining groove 38. In one exemplary embodiment of the present invention, the first and second retaining grooves 36, 38 are molded around the ends 42, 44 in order to retain the first and second antenna wires 30, 34 on the mounting member 28. Alternatively, the ends 42, 44, may be further mechanically retained on the mounting member 28 by any manner commonly known in the art, for instance adhesives, mechanical fasteners or sonic welding may be employed.

Figure 4:
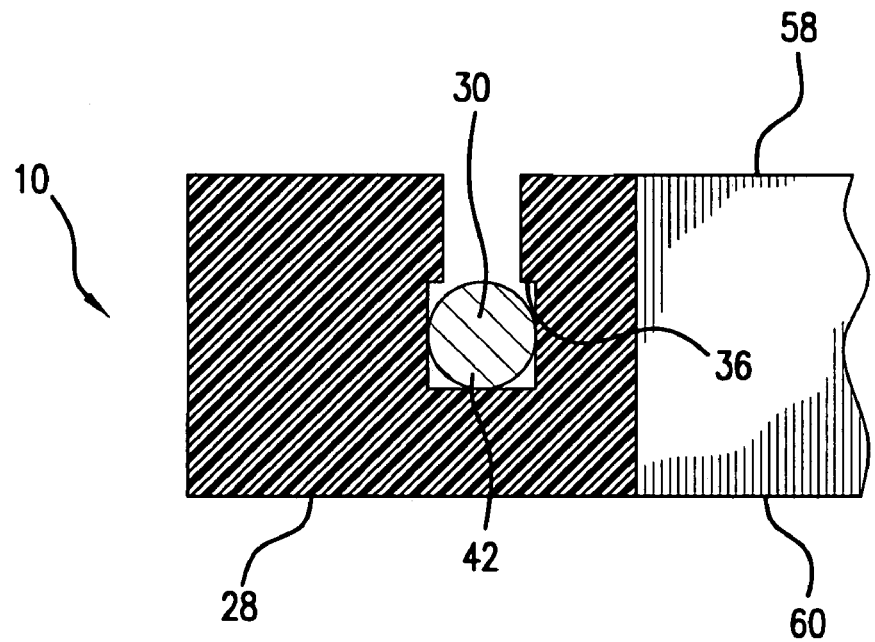
FIG. 4 is a partial cross-sectional view taken along line 4—4 of FIG. 3.

FIG. 4 is a cross-sectional view taken along line 4—4 of FIG. 3. The end 42 of the first antenna wire 30 is shown as being circular in cross section, and retained by the first retaining groove 36 that has a generally square cross-sectional shape. However, it is to be understood that in other exemplary embodiments of the present invention, the cross-sectional shapes of the ends 42, 44 and the retaining grooves 36, 38 may be various shapes. Additionally, the ends 42, 44 may be retained by the retaining grooves 36, 38 alone, or in addition to other forms of attachment commonly known to those skilled in the art.

As can be seen in FIG. 5, the integrated circuit 32 is retained by the mounting member 28. The integrated circuit 32 may be carried by the mounting member 28 through any manner commonly known in the art. The integrated circuit 32 is shown as being located between the ends 42, 44 of the first and second antenna wires 30, 34. In other exemplary embodiments of the present invention the integrated circuit 32 may be positioned at locations that are not between the ends 42, 44.

The mounting member 28 has a longitudinal axis 40. The first retaining groove 36 and a length of the end 42 of the first antenna wire 30 are oriented in a direction perpendicular to the longitudinal axis 40. Additionally, the second retaining groove and a length of the end 44 of the second antenna wire 34 are also oriented in a perpendicular direction to the longitudinal axis 40. This perpendicular orientation may be advantageous in accordance with one exemplary embodiment of the present invention in that tension applied to the first and second antenna wires 30, 34 will not act to pull the ends 42, 44 from the retaining grooves 36, 38. However, it is to be understood that in other exemplary embodiments of the present invention that one or more of the retaining grooves 36, 38 may be oriented in a direction other than perpendicular to the longitudinal axis 40. For instance, one or more of the retaining grooves 36, 38 and consequently the ends 42, 44 may be oriented in a direction parallel to the longitudinal axis 40.

Figure 6:
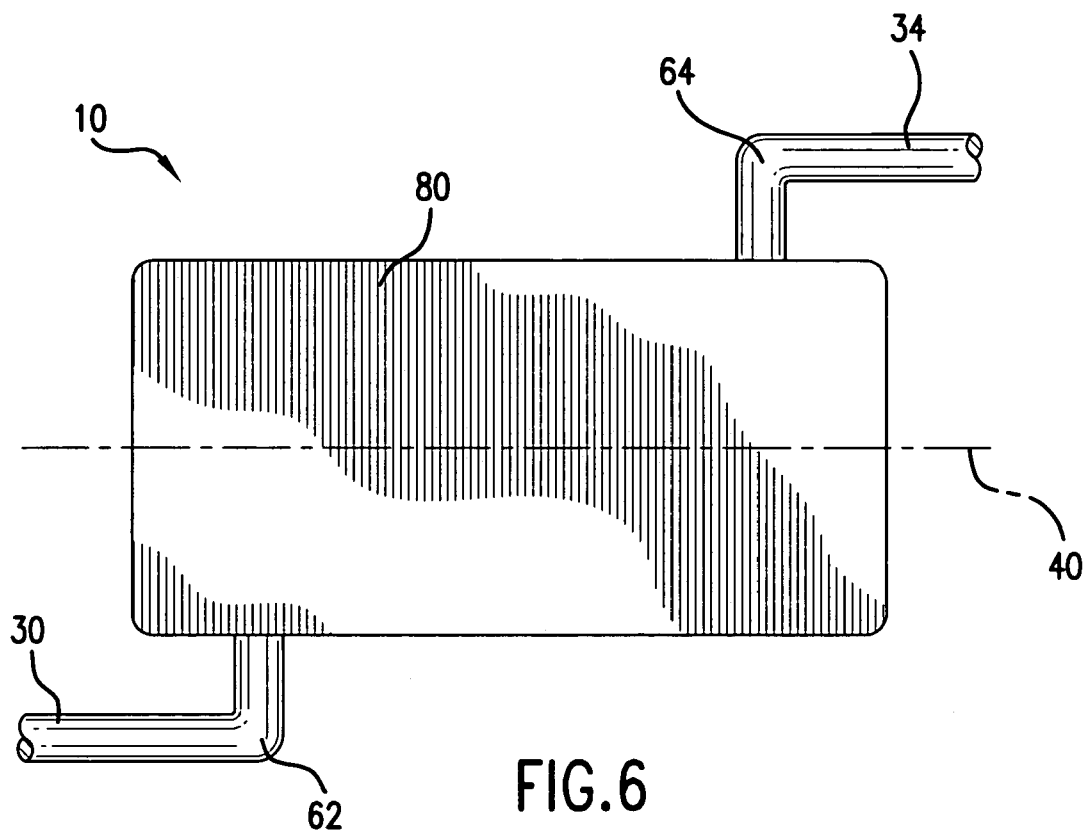
FIG. 6 is a plan view of an exemplary embodiment of an electronics component assembly in accordance with the present invention. Here, the mounting member is a small outline package with a cover and retains a pair of antennas.

The connection between the ends 42, 44 and the retaining grooves 36, 38 in the exemplary embodiments shown in FIG. 5 therefore act to retain the first and second antennas 30, 34 on the mounting member 28. A first communication connection 76 is provided in order to place the first antenna wire 30 into communication with the integrated circuit 32. Additionally, a second communication connection 78 may be provided in order to place a second antenna wire 34 into communication with the integrated circuit 32. The first communication connection 76 may be made of one or more first mounting member wires 68. Similarly, the second communication connection 78 may be made of one or more second mounting member wires 70. A cover 80 in accordance with one exemplary embodiment of the present invention is shown in FIG. 6. The cover 80 may be employed in order to protect the various components of the electronics component assembly 10, or to help further retain the antenna wires 30, 34 onto the mounting member 28.

Figure 7:
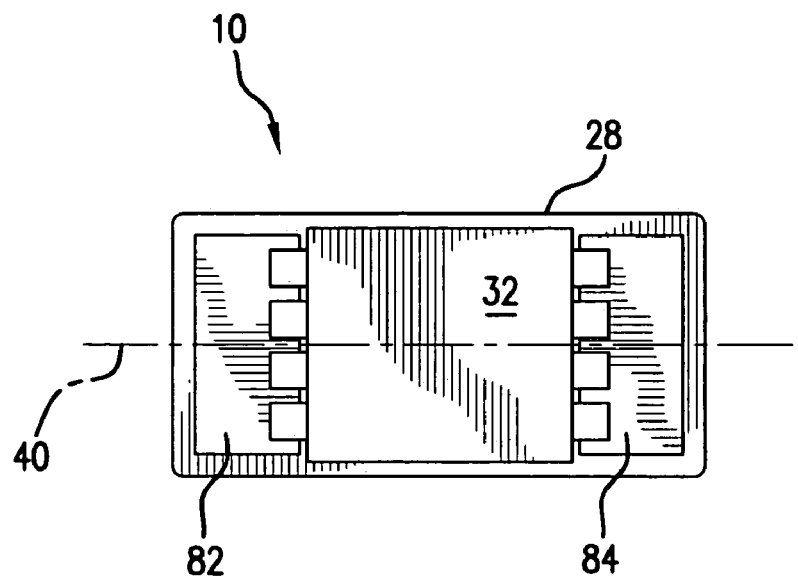
FIG. 7 is a plan view of an exemplary embodiment of an electronics component assembly in accordance with the present invention. A mounting member is shown as being a printed circuit board having a pair of soldering pads.

Although described as being a small outline package (SOP), the mounting member 28 may be any type of member in accordance with other exemplary embodiments of the present invention. For instance, the mounting member 28 is a printed circuit board in accordance with one exemplary embodiment as shown in FIG. 7. The mounting member 28 may be a miniature printed circuit board that is as thin as about 0.006 inches. The mounting member 28 is provided with a first soldering pad 82 and a second soldering pad 84. The integrated circuit 32 may be placed between the first and second soldering pads 82, 84. In accordance with one exemplary embodiment of the present invention, the integrated circuit 32 may be an integrated circuit chip.

Figure 8:
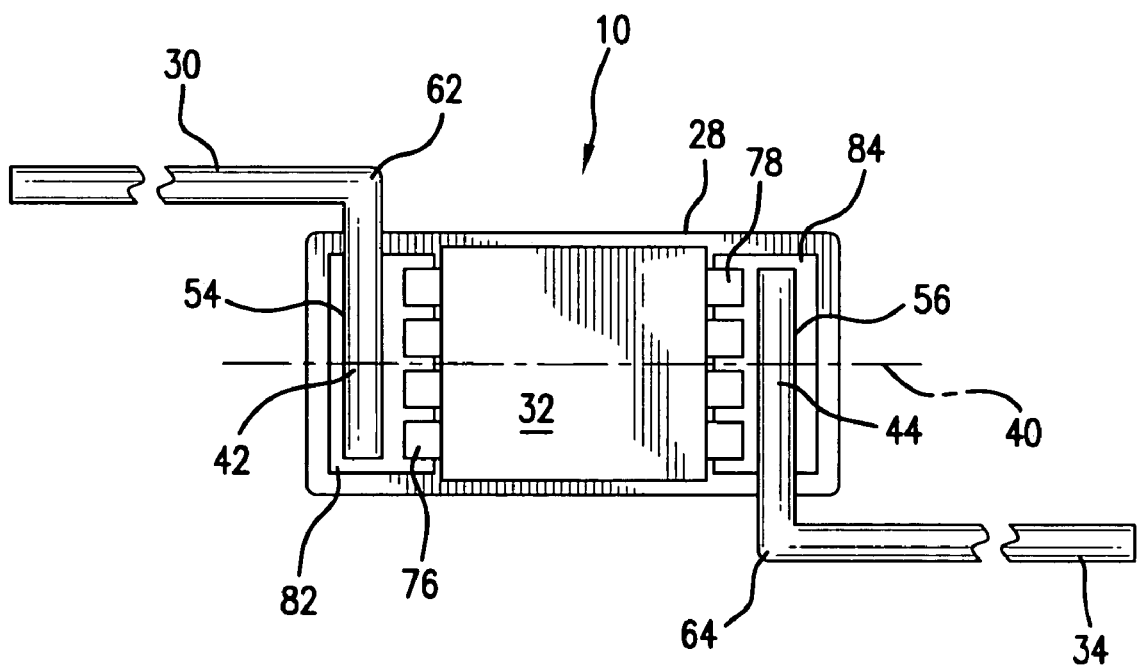
FIG. 8 is a plan view of the exemplary embodiment of the electronics component assembly shown in FIG. 7. A pair of antennas are shown connected to the printed circuit board by a first and second soldering connection.

FIG. 8 shows the first and second antenna wires 30, 34 being carried by the mounting member 28. The end 42 of the first antenna wire 30 may be retained on the first soldering pad 82 through a first soldering connection 54. Likewise, the end 44 of the second antenna wire 34 may be retained on the second soldering pad 84 through a second soldering connection 56. As shown in FIG. 8, the lengths of the ends 42, 44 of the first and second antenna wires 30, 34 are oriented in a direction perpendicular to the longitudinal axis 40 of the mounting member 28. This orientation may also allow for the soldering connections 54, 56 to likewise be perpendicular to the longitudinal axis 40. The perpendicular soldering connections 54, 56 may be advantageous in that they provide for an increased resistance to tearing brought about by tension imparted onto the first and second antenna wires 30, 34.

It is to be understood, however, that in other exemplary embodiments of the present invention that the ends 42, 44 along with the first and second soldering connections 54, 56 may be oriented in a direction parallel to the longitudinal axis 40 or may be oriented at any angle to the longitudinal axis 40. Additionally, the ends 42, 44 and soldering connections 54, 56 need not both be parallel or perpendicular to the longitudinal axis, but in various exemplary embodiments of the present invention the end 42 and the first soldering connection 54 may be positioned at one orientation with respect to the longitudinal axis 40 while the other end 44 and the second soldering connection 56 is positioned at a different orientation with respect to the longitudinal axis 40.

Although described as being attached through the first and second soldering connections 54, 56 it is to be understood that the first and second antenna wires 30, 34 may be attached to the mounting member 28 in any manner commonly known to one skilled in the art in accordance with other exemplary embodiments of the present invention. For instance, adhesion, crimping, mechanical fasteners, and/or welding may be used in addition to or alternatively with soldering in order to effect the aforementioned attachment. As such, the present invention is not limited to a particular type of mechanism or procedure used to attach the first or second antenna wires 30, 34 to the mounting member 28.

The first and second antenna wires 30, 34 are therefore attached to and retained by the mounting member 28 as opposed to being directly connected and retained by the integrated circuit 32. Although the ends 42, 44 may be physically attached to the integrated circuit 32 through the first and second communication connections 76, 78 it is to be understood that the primary retention of the first and second antenna wires 30, 34 in the electronics component assembly 10 is effected through attachment to the mounting member 28.

Figure 9:
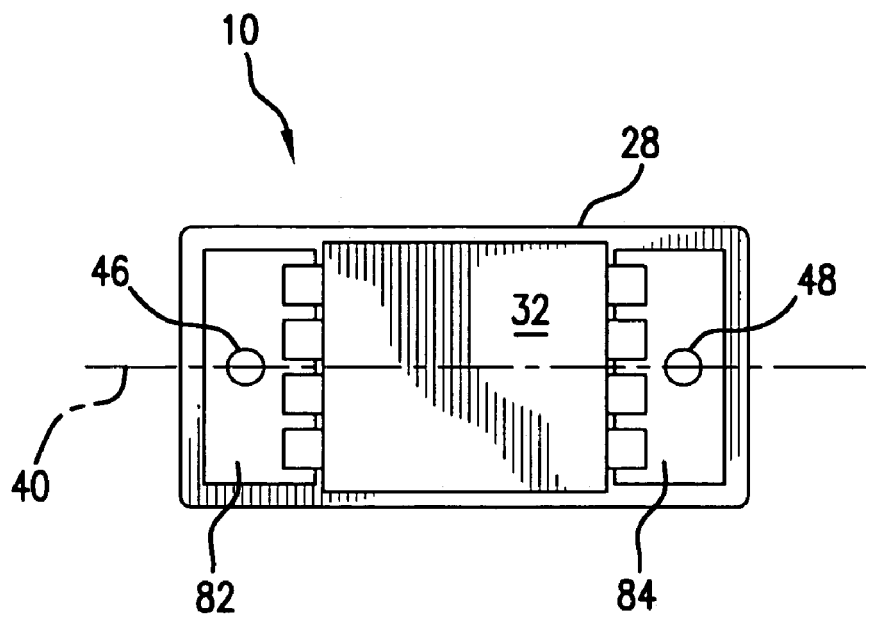
FIG. 9 is a plan view of an exemplary embodiment of an electronics component assembly in accordance with the present invention. Here, the mounting member is a printed circuit board and has a pair of antenna wire receiving apertures therethrough.

FIG. 9 shows an alternative exemplary embodiment of the electronics component assembly 10 in accordance with the present invention. Here, the mounting member 28 is a printed circuit board that has a first antenna wire receiving aperture 46 and a second antenna wire receiving aperture 48 located therethrough. The first antenna wire receiving aperture 46 may be located in the first soldering pad 82, and the second antenna wire receiving aperture 48 may be located in the second soldering pad 84. However, it is to be understood that in other exemplary embodiments of the present invention that the first and second soldering pads 82, 84 are not necessary. The integrated circuit 32 may be carried by the mounting member 28 in any manner as previously described in accordance with various exemplary embodiments of the present invention.

Figure 10:
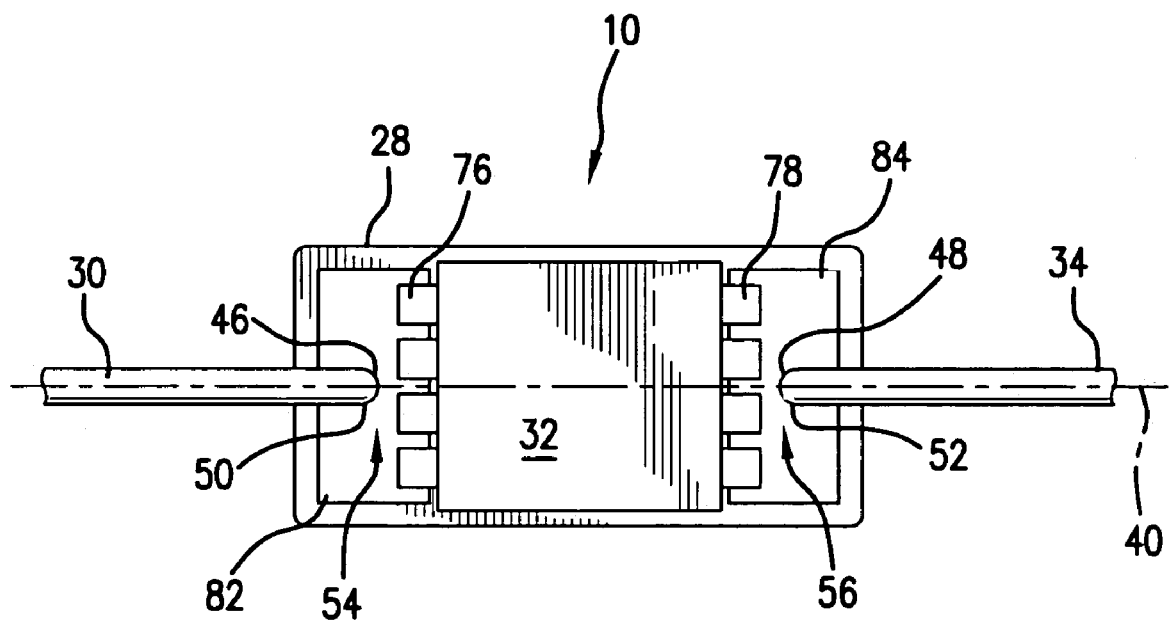
FIG. 10 is a plan view of the electronics component assembly shown in FIG. 9. A pair of antennas each has a hooked end inserted through a respective antenna wire receiving aperture in order to help retain the pair of antennas to the printed circuit board.

FIG. 10 shows the electronics component assembly 10 of FIG. 9 with the pair of antenna wires 30, 34 attached. Here, the first antenna wire 30 is provided with a hooked end 50. The hooked end 50 is inserted through the first antenna wire receiving aperture 46. This configuration may retain the first antenna wire 30 onto the mounting member 28. Additionally, the hooked end 50 may be soldered onto the first soldering pad 82 through the first soldering connection 54. This soldering attachment may help to provide additional attachment of the first antenna wire 30 to the mounting member 28. Similarly, the second antenna wire 34 is provided with a hooked end 52 that is inserted through the second antenna wire receiving aperture 48. Again, the hooked end 52 may be soldered onto the second soldering pad 84 through the second soldering connection 56 to provide for an additional attachment of the second antenna wire 34 to the mounting member 28. Alternatively, the soldering connections 54, 56 need not be employed and as such, the antenna wires 30, 34 may be retained by their physical engagement to the mounting member 28 without any soldering or welding.

The first antenna wire 30 and the integrated circuit 32 may be placed into communication with one another through the first soldering connection 54 and the first communication connection 76. Likewise, the second antenna wire 34 and the integrated circuit 32 may be placed into communication with one another through the second soldering connection 56 and the second communication connection 78. However, it is to be understood that in other exemplary embodiments of the present invention that the first and second antenna wires 30, 34 may directly contact the first and second communication connections 76, 78 in order to place the integrated circuit 32 into communication with the first and second antenna wires 30, 34. For instance, the hooked end 50 may contact the first communication connection 76 and the hooked end 52 may contact the second communication connection 78 in order to provide for communication between the integrated circuit 32 and the antenna wires 30, 34.

Another exemplary embodiment of the electronics component assembly 10 is shown in FIG. 11. Here, the mounting member 28 may be a printed circuit board that has a first side 58 and a second side 60. The first side 58 may be opposite from the second side 60. The mounting member 28 may have the first and second antenna wire receiving apertures 46, 48 disposed therethrough from the first side 58 to the second side 60.

The first antenna wire 30 may have a bend 62 and an end 42 that may be disposed through the first antenna wire receiving aperture 46. A first bonded connection 72 may be used to affix the first antenna wire 30 to the mounting member 28. The first bonded connection 72 may therefore be used in combination with the first antenna wire receiving aperture 46 in order to retain the first antenna wire 30 onto the mounting member 28. The first bonded connection 72 may be made in any manner commonly known in the art. For instance, the first bonded connection 72 may be made from soldering, gluing, welding, or another type of bonding.

Although shown as disposed through the first antenna wire receiving aperture 46 and extending to a point away from the second side 60, it is to be understood that in other exemplary embodiments of the present invention that the end 42 of the first antenna wire 30 may be cut or so otherwise positioned so as to extend through the first antenna wire receiving aperture 46 and terminate at the second side 60 so as to be flush with the second side 60. As such in other exemplary embodiments of the present invention, the end 42 of the first antenna wire 30 does not need to be present on or away from the second side 60. Additionally, this arrangement may be used with other antenna wires, such as the second antenna wire 34 that may be incorporated into the electronics component assembly 10.

The second antenna wire 34 shown in the exemplary embodiment in FIG. 11 has bend 64 in order to form a hooked end 52 such that the end 44 of the second antenna wire 34 extends along a length of the second side 60. The hooked end 52 is disposed through the second antenna wire receiving aperture 48. By having a portion of the second antenna wire 34 located on both the first side 58 and the second side 60, a greater area for bonding the second antenna wire 34 to the mounting member 28 may be realized. Here, a second bonded connection 74 may be employed on both the first side 58 and the second side 60. Again, the second bonded connection 74 may be formed in any manner known in the art. For example, soldering, welding, gluing, or other types of bonding may be employed. The bends 62 and 64 may be either 90 degrees or may be a hook such that the bends are 180 degrees in accordance with various exemplary embodiments of the present invention.

The second antenna wire 34 has a main body 66. Although shown as being substantially straight, the main body 66 of the second antenna wire 34 may be of other configurations in accordance with various exemplary embodiments of the present invention. For instance, the main body 66 may be serpentine, helical, or saw tooth in accordance with other exemplary embodiments of the present invention. Various configurations of the main body 66 may help to protect the second antenna wire 34 from breaking during construction and/or during the flexing of the tire 12 (FIGS. 1 and 2). Additionally, the second antenna wire 34 may have a loop 86 located at one end thereof in order to assist in information communication and help secure the end 86 in the cured tire 12 (FIGS. 1 and 2). Likewise, the first antenna wire 30 may be of any shape as previously mentioned with respect to the main body 66 of the second antenna wire 34. Additionally, the first antenna wire 30 may also have a loop 86 as mentioned with the second antenna wire 34 in accordance with other exemplary embodiments of the present invention.

FIG. 12 shows an alternative exemplary embodiment of the present invention where the first and second antenna wires 30, 34 are located on the second side 60 of the mounting member 28 and inserted through respective first and second antenna wire receiving apertures 46 and 48. A portion of the first and second antenna wires 30, 34 may extend onto the first side 58 of the mounting member 28 and be adhered thereon through the first and second bonded connections 72, 74. The integrated circuit 32 is shown attached to the first side 58 of the mounting member 28. In other exemplary embodiments of the present invention, however, the integrated circuit 32 may be placed on the second side 60, or may be present on both the first and second sides 58, 60 of the mounting member 28. The first communication connection 76 places the integrated circuit 32 into communication with the first antenna wire 30. Similarly, the second communication connection 78 places the second antenna wire 34 into communication with the integrated circuit 32. The first communication connection 76 may be a first mounting member wire 68 that connects the integrated circuit 32 to the first bonded connection 72 in order to place the integrated circuit 32 into communication with the first antenna wire 30. Additionally, the second communication connection 78 may be a second mounting member wire 70 connected to the integrated circuit 32 and the second bonded connection 74 in order to place the second antenna wire 34 into communication with the integrated circuit 32.

The integrated circuit 32 may first be attached to the mounting member 28. Next, the first or second antenna wires 30, 34 may be subsequently attached to the mounting member 28. However, in other exemplary embodiments of the present invention, the integrated circuit 32 may be connected to the mounting member 28 after connection of the first or second antenna wires 30, 34 occurs. The present invention encompasses various exemplary embodiments where the components of the electronics component assembly 10 are assembled and connected in different sequences and manners. Additionally, although described as being either a small outline package or printed circuit board, the mounting member 28 may be of different configurations in accordance with other exemplary embodiments of the present invention.

In accordance with one exemplary embodiment of the present invention, the integrated circuit 32 may be made up of a silicon chip and a radio frequency device. However, it is to be understood that the integrated circuit 32 may be of various configurations in accordance with other exemplary embodiments of the present invention. Although the drawings show the mounting member 28 as having a rectangular configuration, it is to be understood that in other exemplary embodiments of the present invention, the mounting member 28 may be of shapes other than rectangular.

The first and second antenna wires 30, 34 may be constructed out of any material known in the art. For instance, the antenna wires 30, 34 may be made out of copper, aluminum, and/or nickel. Additionally, any number of the antenna wires may be used in accordance with the present invention. For instance, in accordance with one exemplary embodiment of the present invention only the first antenna wire 30 is used in the electronics component assembly 10. Alternatively, three or more antenna wires may be used in other exemplary embodiments.

Another exemplary embodiment of the present invention makes use of an electronics component assembly 10 as shown in FIG. 25. The embodiment shown in FIG. 25 includes an integrated circuit 138 with a first and second antenna wire 134 and 136. The antenna wires 134, 136 are connected to a mounting member 28 that may be partially curved in shape and are not directly connected to the integrated circuit 138. This arrangement provides for a more robust connection due to the fact that a stronger physical connection may be made between the first and second antenna wires 134, 136 and the mounting member 28 as opposed to a connection between the first and second antenna wires 134, 136 and the integrated circuit 138. The first and second antenna wires 134, 136 may further be placed into communication with the integrated circuit 138 through first and second mounting member wires 150, 152 as shown in FIG. 25.

Figure 13:
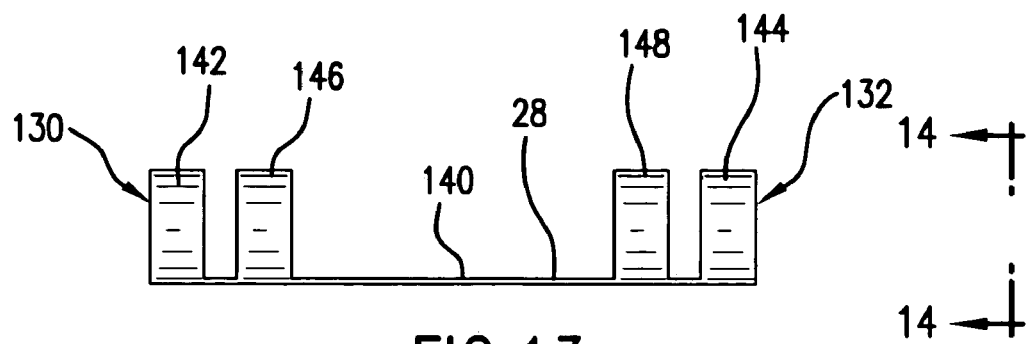
FIG. 13 is a side elevation view of a mounting member in accordance with one exemplary embodiment of the present invention. Here, the first and second retaining connections are made of four pairs of fingers that are semi-circular in shape.
Figure 14:
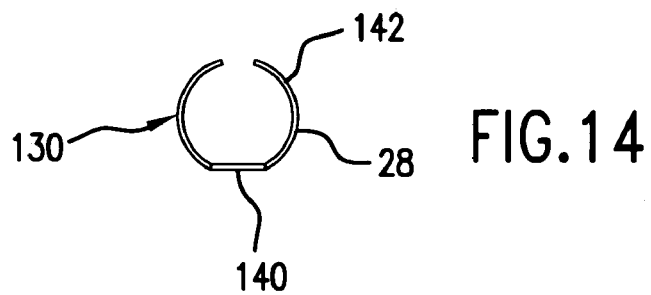
FIG. 14 is a front elevation view taken along line 14—14 of FIG. 13.

A mounting member 28 used in an exemplary embodiment of the electronics component assembly 10 is shown in FIGS. 13 and 14. The mounting member 28 may include a flat base 140 onto which first and second retaining connections 130, 132 may be attached. The flat base 140 may be formed separate from the first and second retaining connections 130, 132 or may alternatively be formed integral with the first and second retaining connections 130, 132. As such, the mounting member 28 may either be a single piece or may be formed from multiple components in accordance with various exemplary embodiments of the present invention.

The first retaining connection is shown as including a first pair of fingers 142 and a third pair of fingers 146. Likewise, the second retaining connection 132 includes a second pair of fingers 144 and a fourth pair of fingers 148. The pairs of fingers 142, 144, 146, and 148 may all be semi-circular in shape and may be attached to the flat base 140. However, it is to be understood that in other exemplary embodiments of the present invention that the pairs of fingers 142, 144, 146, and 148 may be shapes other than semi-circular. For instance, the pairs of fingers 142, 144, 146, and 148 may be connected such that they are generally in the shape of a ring. Additionally, it is to be understood that in other exemplary embodiments of the present invention that four pairs of fingers 142, 144, 146, and 148 need not be employed. For instance, in one exemplary embodiment of the present invention only the first pair of fingers 142 need be employed. In other exemplary embodiments of the present invention, any number may be used in the mounting member 28.

Figure 15:
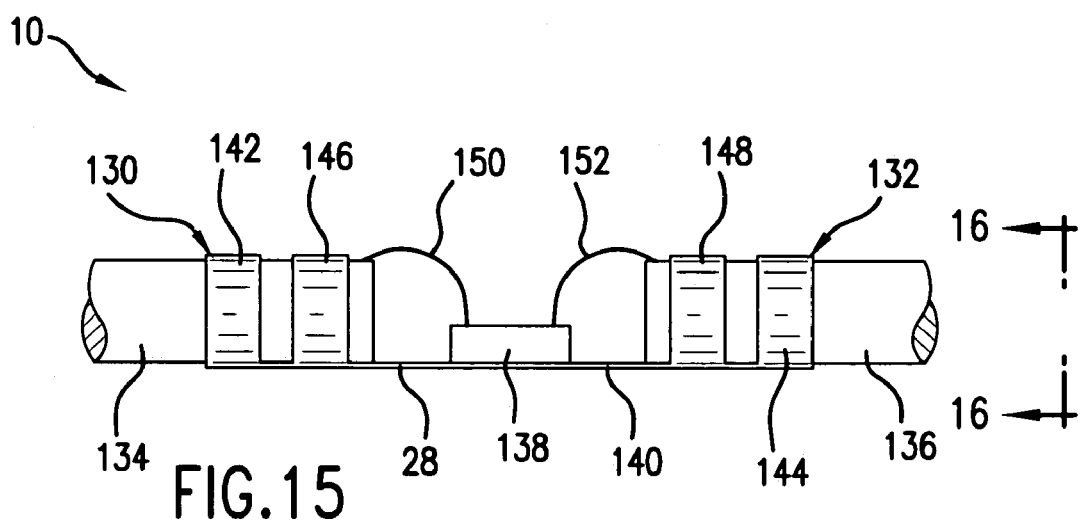
FIG. 15 is a side elevation view of an electronics component assembly in accordance with an exemplary embodiment of the present invention. First and second antenna wires are connected to the mounting member and are placed into electrical communication with an integrated circuit through first and second mounting member wires.
Figure 16:
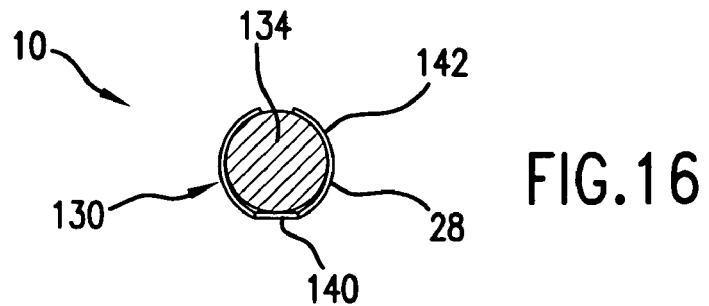
FIG. 16 is a front elevation view taken along line 16—16 of FIG. 15.

FIGS. 15 and 16 show an exemplary embodiment of the electronics component assembly 10 that employs the mounting member 28 shown in FIGS. 13 and 14. The first antenna wire 134 may be retained on the mounting member 28 by the first pair of fingers 142 and the third pair of fingers 146. The first and third pair of fingers 142, 146 may be formed around the first antenna wire 134 or may be crimped around the first antenna wire 134 in order to effect this retention. Alternatively, the first antenna wire 134 may be connected to the first and third pair of fingers 142, 146 by a variety of mechanisms: for instance adhesion, mechanical fasteners, or welding may be employed in various exemplary embodiments of the present invention. Once retained on the mounting member 28, the first antenna wire 134 may be placed into electrical communication with the integrated circuit 138 through a first, mounting member wire 150. As can be seen, the first antenna wire 134 is either totally retained by, or substantially retained by, the first and third pair of fingers 142, 146 instead of the first mounting member wire 150. In one exemplary embodiment of the present invention, the first and third pair of fingers 142, 146 may be made of a material that is rigid and non conductive at RF frequencies. For instance, the first and third pair of fingers 142, 146 may be made of a thermo plastic material, ryton, or a ceramic material in various exemplary embodiments. Should the fingers 142, 146 be conductive at RF frequencies, insulation between the first antenna wire 134 and second antenna wire 136 must be provided.

The integrated circuit 138 may be retained by the mounting member 28 on the flat base 140. The integrated circuit 138 may be retained by using any type of retention commonly known in the art. For instance, thermoplastic bonding, glue, or other adhesive bonding may be employed. The first mounting member wire 150 may be connected to the integrated circuit 138 and the first antenna wire 134 by any connection commonly known in the art. The electronics component assembly 10 shown in FIGS. 15 and 16 is also provided with a second antenna wire 136 that is retained by the second pair of fingers 144 and the fourth pair of fingers 148 onto the mounting member 28. The configuration of these elements may be effected in the same manner as previously discussed with respect to the first antenna wire 34 and the first and third pair of fingers 142, 146. Further, a second mounting member wire 152 may be employed in order to place the second antenna wire 136 into electrical communication with the integrated circuit 138. The second mounting member wire 152 may be configured in a manner similar to the first mounting member wire 150 as previously discussed. Although shown as employing two antennas 134, 136 and respective first and second retaining connections 130, 132 that use fingers, it is to be understood that in other exemplary embodiments of the present invention that any number of antennas and corresponding retaining connections may be employed. The dipole arrangement disclosed in FIGS. 15 and 16 are only one exemplary embodiment of the present invention. For instance, an exemplary embodiment of the present invention exists in providing for only a first antenna wire 134 and a first retaining connection 130, without any further antenna wires or retaining connections being present.

Figure 17:
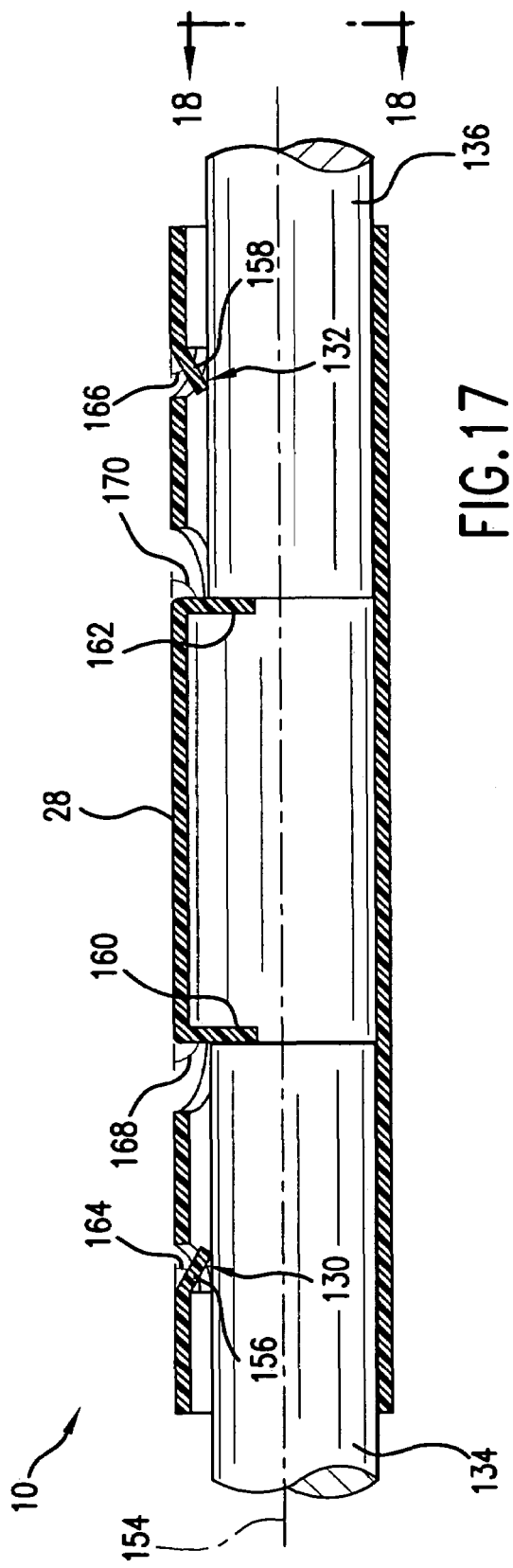
FIG. 17 is a partial cross-sectional elevation view of a mounting member in accordance with one exemplary embodiment of the present invention. The mounting member is generally tubular in shape and has a first and second angled portion used to retain the first and second antenna wires onto the mounting member.
Figure 18:
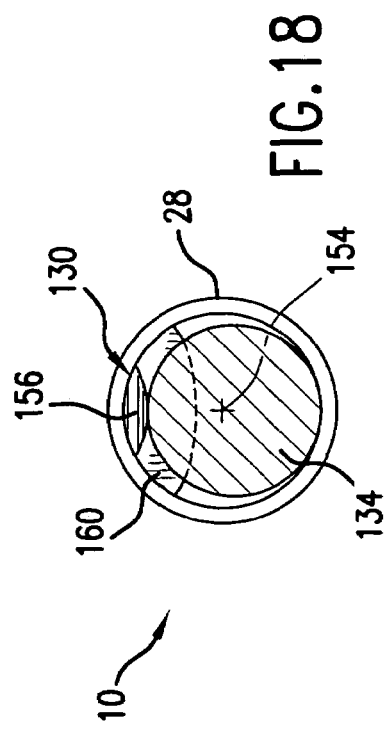
FIG. 18 is a front elevation view taken along line 18—18 of FIG. 17.

Another exemplary embodiment of the mounting member 28 in accordance with the present invention is shown in FIGS. 17 and 18. Here, the mounting member 28 is generally tubular in shape. Again, the mounting member 28 may be made of a material that is non-conducting at RF frequencies such as plastic, or non-conducting metals such as ryton. However, it is to be understood that in other exemplary embodiments of the present invention, that the mounting member 28 may be made of a material that is conducting at RF frequencies, however for a plurality of antenna wires 134, 136 insulation should be provided.

The first retaining connection 130 is shown as being a first angled portion 156. The first angled portion 156 may be formed by making a cut in a portion of the wall of the mounting member 28. As such, the cut may be semi-circular in shape, and once made the first angled portion 156 may be bent at a first angle portion angle 164 with respect to an axis 154 of the mounting member 28. The first angled portion 156 may be permanently deformed at the first angled portion angle 164. Alternatively, the first angled portion 156 may not be permanently deformed in other exemplary embodiments. In accordance with one exemplary embodiment of the present invention, the first angled portion angle 164 is 45°. However, it is to be understood that in other exemplary embodiments of the present invention that the first angled portion angle 164 may be at an angle other than 45°. For instance, in various exemplary embodiments of the present invention, the first angled portion angle 164 may be 10°, 30°, 70°, 90°, or 170° in various exemplary embodiments.

Again, the first angled portion angle 164 is 45° in the exemplary embodiment shown in FIGS. 17 and 18. The first antenna wire 134 may be inserted into the mounting member 28 and advanced past the first angled portion 156. The first angled portion 156 acts as a "gripper" to restrain the first antenna wire 134 and prevent it from moving out of the mounting member 28. Although shown as having only one first angled portion 156, it is to be understood that several first angled portions 156 may be placed around the circumference of the mounting member 28 in various exemplary embodiments of the present invention to assist in retaining the first antenna wire 134 on the mounting member 28. It may be beneficial to keep the length of the cut that is used to make the angle 164 of the first angled portion 156 less than the diameter of the mounting member 28 in order to ensure that the mounting member 28 is not weakened. Although described as being formed through making a cut in the mounting member 28, it is to be understood that the first angled portion 156 may be formed in any manner commonly known to those skilled in the art. For instance, the first angled portion angle 156 may be formed with the mounting member 28 through casting, injection molding, or other manufacturing methods.

Also included in the mounting member 28 shown in FIGS. 17 and 18 is a second retaining connection 132 that includes a second angled portion 158. Again, the second angled portion 158 is formed by a cut in the wall of the mounting member 28 and is bent at a second angled portion angle 166 with respect to the axis 154 of the mounting member 28.

The second angled portion 158 may also act like a gripper in order to engage the second antenna wire 136 and prevent it from disengaging the mounting member 28. The second retaining connection 132, that includes the second angled portion 158, may be configured in a manner similar to the first retaining connection 130 and the first angled portion 156 as previously discussed. Additionally, the second angled portion angle 166 is shown as being 45°, but may be configured at any angle, as previously mentioned with respect to the first angled portion angle 164. Therefore, the description given with respect to the first retaining connection 130, the first angled portion 156, and the first angled portion angle 164 may also be used to describe the second retaining connection 132, the second angled portion 158, and the second angled portion angle 166.

The mounting member 28 shown in FIGS. 17 and 18 also has another semi-circular cut located thereon. This cut is used to form a first stop 160 which is a portion of the wall of the mounting member 28 bent at a first stop angle 168 with respect to the axis 154. Here, the first stop angle 168 is 90°. However, it is to be understood that in other exemplary embodiments of the present invention, that the first stop angle 168 may be at an angle other than 90°. For instance, in various exemplary embodiments of the present invention, the first stop angle 168 may be 30°, 45°, 70°, 120°, or 160° in various exemplary embodiments. The first stop angle 168 may be permanently deformed at the first stop angle 168, or may be flexible in various exemplary embodiments. The flexibility of the first stop 160 may be imparted due to the material comprising the mounting member 28. As with the first angled portion 156, the first stop 160 may be formed by a semi-circular cut that is only a portion of the circumference of the mounting member 28 in order to ensure that the mounting member 28 is not weakened. Also, instead of one first stop 160, several may be formed around the circumference of the mounting member 28 in other exemplary embodiments. The first stop 160 serves as a mechanical stop to prevent the first antenna wire 134 from entering too far into the mounting member 28. This may be due to the fact that other components of the electronics component assembly 10 may be placed in or on the mounting member 128 (such as the integrated circuit 138) and it may be necessary to properly or precisely position the first antenna wire 134 on the mounting member 28.

Also shown in the exemplary embodiment of FIGS. 17 and 18 is a second stop 162 that is positioned at a second stop angle 170 of 90° with respect to the axis 154. Again, the second stop 162 may be configured in a manner similar to the first stop 160 as previously discussed. As with the fist stop 160, the second stop 162 may be made from a semi-circular cut in the mounting member 28 or may be formed from a process such as casting or injection molding into the mounting member 28. Additionally, the second stop angle 170 may be at any angle, and may also be configured as previously discussed with respect to the first stop angle 168. The second stop 162 may serve as a mechanical stop to prevent the second antenna wire 136 from entering too far into the mounting member 28. Additionally, the second stop 162 may also be employed to properly position the second antenna wire 136 on the mounting member 28.

Figure 19:
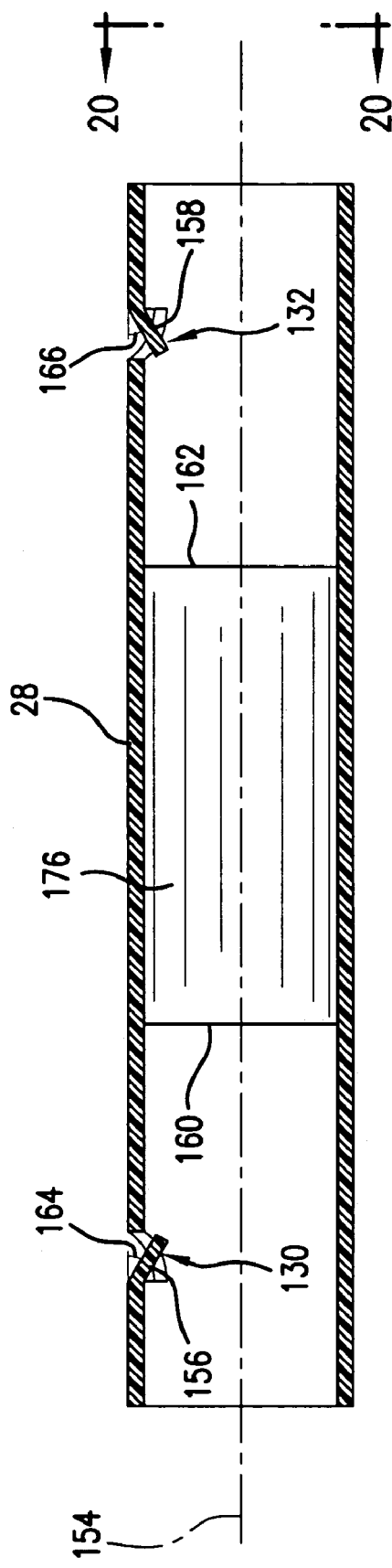
FIG. 19 is a partial cross-sectional elevation view of a mounting member in accordance with one exemplary embodiment of the present invention. Here, the mounting member is generally tubular in shape with a solid central section, and has a first and second angled portion extending from a portion of the wall of the mounting member.
Figure 20:
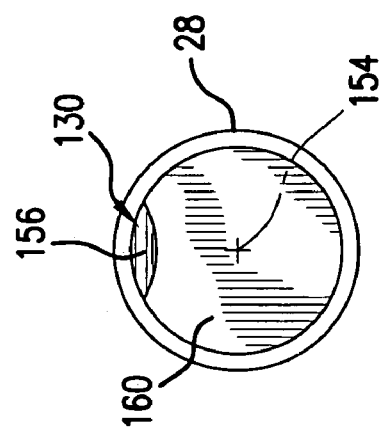
FIG. 20 is a front elevation view taken along line 20—20 of FIG. 19.

Another exemplary embodiment of the mounting member 28 is shown in FIGS. 19 and 20. Here, the mounting member 28 is provided with first and second retaining connections 130, 132 that include the first and second angled portions 156, 158. The first and second retaining connections 130, 132 are therefore configured in a manner similar to the exemplary embodiment of the mounting member 28 as previously discussed with respect to FIGS. 17 and 18. However, here the mounting member 28 includes a solid central section 176. The solid central section 176 has the first stop 160 and the second stop 162 located on opposite ends. Therefore in this exemplary embodiment of the mounting member 28, the mounting member 28 does not need to be cut in order to form the first and second stops 160, 162. The first and second stops 160, 162 function in the same way as previously discussed to properly position the first and second antenna wires 134, 136 on the mounting member 28. The solid central section 176 may be formed by crimping or adhering a solid cylindrical shape to the mounting member 28. Alternatively, the solid central section 76 may be formed by shaping the entire mounting member 28 from a cylindrical shaped solid piece, therefore forming pockets on either end of the piece for acceptance of the first and second antenna wires 134, 136. As such, the solid central section 176 may be formed on the mounting member 28 through any method commonly known to those skilled in the art. Further, the solid central section 176 may, instead of being completely solid throughout, have a cavity therein that allows for placement of various components of the electronics component assembly 10. Also, the integrated circuit 138 may be mounted on the outside of the solid central section 176, or as stated a cavity could be made in the solid central section in order to mount the integrated circuit therein.

Figure 21:
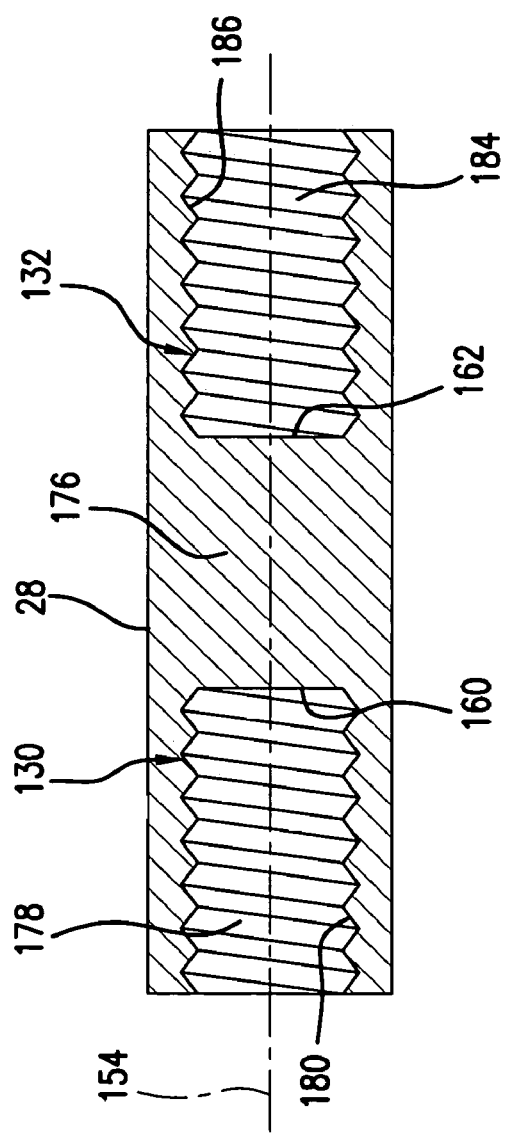
FIG. 21 is a cross-sectional elevation view of a mounting member in accordance with one exemplary embodiment of the present invention. Here, the mounting member is a generally solid cylinder with a first and second retaining connection that are each a cylindrical cavity with internal threads.
Figure 22:
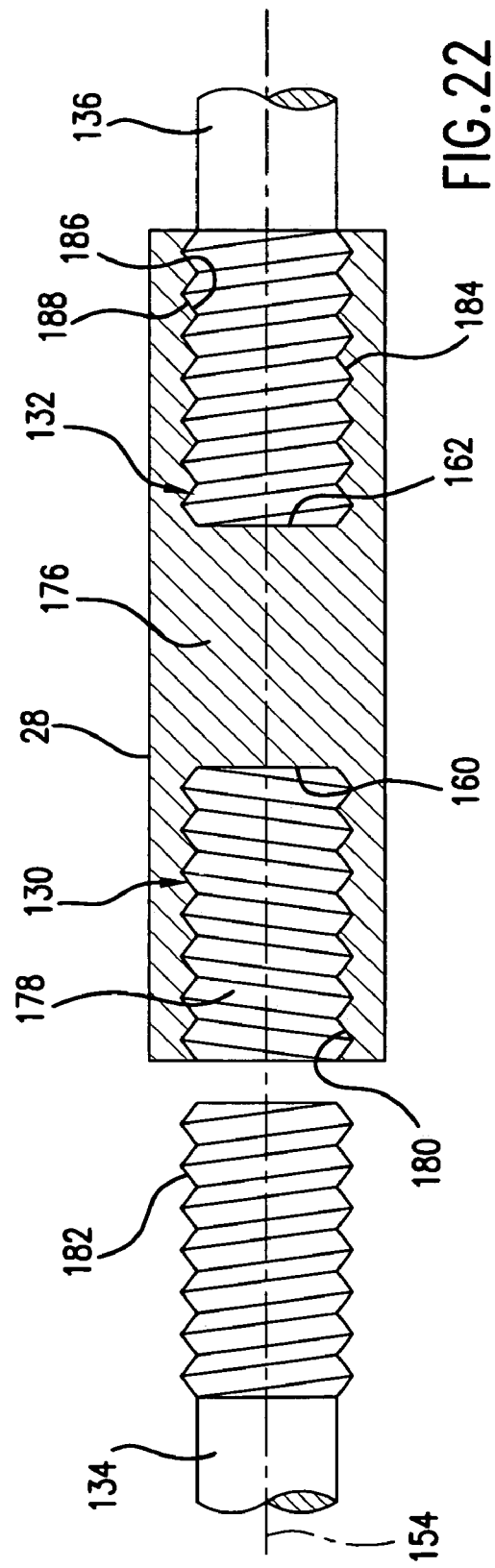
FIG. 22 shows the mounting member of FIG. 21 with a first and second antenna having external threads configured to be engaged with the internal threads of the first and second retaining connections.

Another exemplary embodiment of the mounting member 28 is shown in FIGS. 21 and 22. Here, the mounting member 28 is in the shape of a generally solid cylinder with the first and second retaining connections 130, 132 located on either end. The first retaining connection 130 is a cylindrical cavity 178 that has a plurality of internal threads 180 located thereon. The first stop 160 is located at one end of the cylindrical cavity 178. Likewise, the second retaining connection 132 is a cylindrical cavity 184 that also has a plurality of internal threads 186 located thereon. The second stop 162 is located at one end of the cylindrical cavity 184.

The first antenna wire 134 and the second antenna wire 136 are shown in FIG. 22. Here, the first antenna wire 134 has external threads 182 located on one end thereof. Likewise, the second antenna wire 136 has external threads 188 also located on one end thereof. The external threads 182 of the first antenna wire 134 are engageable with the internal threads 180 of the first retaining connection 130. Similarly, the external threads 188 on the second antenna wire 136 are engageable with the internal threads 186 of the second retaining connection 132. The engagement between the external threads 182, 188 and the internal threads 180, 186 acts to retain the first and second antenna wires 134, 136 to the mounting member 28. The first antenna wire 134 may be advanced into the cylindrical cavity 178 to the first stop 160. Likewise, the second antenna wire 136 may be advanced into the cylindrical cavity 184 to the second stop 162.

The external threads 182, 188 may either be integrally formed with the first and second antenna wires 134, 136 or may be located on a component that is attached to the first and second antenna wires 134, 136. The thread form shown in FIGS. 21 and 22 is of a shape V form. It is to be understood that in other exemplary embodiments of the present invention, that the thread form used may be of any type commonly known to those skilled in the art. For instance, in other exemplary embodiments of the present invention the external threads 182, 188 and the internal threads 180, 186 may be of a unified-UN, whitworth, acme, square, or buttress form. The present invention encompasses various exemplary embodiments where the form, pitch, diameter, series, and class of the external threads 182, 188 and the internal threads 180, 186 is employed. Although not shown, the integrated circuit 138 and associated electronics could be mounted on the exterior of the mounting member 28, or a cavity may be made in the mounting member 28 in order to mount the integrated circuit 138 therein.

Another exemplary embodiment of the mounting member 28 is shown in FIGS. 23 and 24. Here, the first retaining connection 130 includes the cylindrical cavity 178 with the first stop 160 and an annular recess 190 located thereon. The second retaining connection 132 also includes the cylindrical cavity 184 with the first stop 162 and an annular recess 192 located thereon. The annular recesses 190, 192 are shown having a substantially uniform, square shaped cross-section. It is to be understood that in other exemplary embodiments of the present invention that the annular recesses 190, 192 may be of other shapes or configurations known to those skilled in the art. The first antenna wire 134 is provided with an annular projection 194. Additionally, the second antenna wire 136 is provided with an annular projection 196. The annular projections 194, 196 are shown as having a beveled portion and a portion having a substantially uniform diameter. The beveled portion of the annular projections 194, 196 aides in their insertion into the cylindrical cavities 178, 184 which may be of a smaller diameter than the outside diameter of the annular projections 194, 196. The first and second antenna wires 134, 136 are inserted into the first and second cylindrical cavities 178, 184 and may be positioned up to the first and second stops 160, 162 respectively. As can be seen in FIG. 24, the annular projection 194 is fit into the annular recess 190 and engaged thereon. Likewise, the annular projection 196 is fit into the annular recess 192 and retained thereon. In this manner, the first and second antenna wires 134, 136 may be retained on the mounting member 28.

The first and second annular projections 194, 196 may be formed by stamping an end of the first and second antenna wires 134, 136. Alternatively, the annular projections 194, 196 may be separate pieces that are attached to the first and second antenna wires 134, 136. Alternatively, the antenna wires 134, 136 may have several portions recessed from the circumference of the first and second antenna wires 134, 136 that engage corresponding projections within the cylindrical cavities 178, 184 in other exemplary embodiments of the present invention. Likewise, although shown as having only a single annular projection 194, 196 it is to be understood that in other exemplary embodiments of the present invention that the first and second antenna wires 134, 136 may be provided with two or more annular projections 194, 196.

After insertion of the first and second antenna wires 134, 136 into the cavities 178, 184 of the mounting member 28 the assembly may be stamped in order to form a mechanical crimp that further strengthens the connection of the first and second antenna wires 134, 136 to the mounting member 28. Alternatively, a heated anvil may be used to thermally deform the mounting member 28 such that it more strongly grips the first and second antenna wires 134, 136 once inserted therein.

FIG. 25 shows an exemplary embodiment of the electronics component assembly 10 where a flat portion 172 is included in the mounting member 28. The integrated circuit 138 is attached to the flat portion 172 and retained thereon. The first mounting member wire 150 is run to the first antenna wire 134 to place the first antenna wire 134 into electrical communication with the integrated circuit 138. Likewise, the second mounting member wire 152 connects the second antenna wire 136 and the integrated circuit 138 to place these two components into electrical communication with one another. It is to be understood that the flat portion 172 may be incorporated into the previously discussed exemplary embodiments of the mounting member 28 to provide for a location of attaching the integrated circuit to the mounting member 28. Alternatively, the flat portion 172 may not be employed in other exemplary embodiments of the present invention which instead provide for alternative ways of connecting the integrated circuit 138 to the mounting member 28. For example, in certain exemplary embodiments of the present invention the integrated circuit 138 may be attached to the outer surface of the mounting member 28, or in a chamber or cavity within mounting member 28.

Although shown as having the first and second mounting member wires 150, 152 it is to be understood that in other exemplary embodiments of the present invention the first and second antenna wires 134, 136 may be placed into communication with the integrated circuit 138 in other manners. For instance, a soldering connection may be employed to place the first and second antenna wires 134, 136 into electrical communication with the integrated circuit 138. Additionally, the first and second antenna wires 134, 136 may directly contact the integrated circuit 138 in order to place the first and second antenna wires 134, 136 into electrical communication therewith. Although the first and second antenna wires 134, 136 may be physically attached to the integrated circuit 132 through, for instance, the first and second mounting member wires 150, 152 it is to be understood that the primary retention of the first and second antenna wires 134, 136 and the electronics component assembly 10 is made through attachment to the mounting member 28.

The mounting member 28 shown in FIG. 25 employes the first and second angled portions 156, 158 as the first and second retaining connections 130, 132. As can be see in FIG. 26, the first and second antenna wires 34, 36 are not coaxial with the mounting member 28. However, in other exemplary embodiments of the present invention the first and second antenna wires 134, 136 may in fact be coaxial with the mounting member 28.

A cover 174 is included that protects the integrated circuit 138. Additionally, the cover 174 may be used to protect other components of the electronics component assembly 10 such as the first and second mounting member wires 150, 152 and/or portions of the first and second antenna wires 134, 136. The cover 174 may be of any configuration commonly known in the art. For instance in one exemplary embodiment of the present invention, the cover 174 may be a coating with a hard cover included thereon. FIG. 27 shows the cover 174 located on the outer surface of the mounting member 28. Here the electronics component assembly 10 is shown as being incorporated on the inner surface 16 of the tire 12. Although shown as being substantially straight, it is to be understood that the first and second antenna wires 134, 136 may be of other configurations in accordance with other exemplary embodiments of the present invention. For instance, the first and second antenna wires 134, 136 may be helical, serpentine, or saw tooth in shape in accordance with other exemplary embodiments. Further, the cover 174 need not only be included on a portion of the mounting member 28, but may in fact cover the entire mounting member 28 in accordance with other exemplary embodiments. Alternatively, it is not necessary to include the cover 174 in accordance with various exemplary embodiments of the present invention.

The present invention includes various exemplary embodiments where the different configurations of the first and second retaining connections 130, 132 may be used in combination with one another. For instance, the annular projections 194, 196 and the annular recesses 190, 192 shown in FIGS. 23 and 24 may be combined with the external threads 182, 188 and the internal threads 180, 186 shown in FIGS. 21 and 22. In such a combination, the resulting mounting member 28 may employ both types of connections. As such, two or more of the types of retaining connections 130 may be used to attach the first antenna wire 134 to the mounting member 28. Additionally, two or more of the types of the second retaining connection 132 may be used to attach the second antenna wire 136 to the mounting member 28. Alternatively, one type of the first retaining connection 130 may be used to attach the first antenna wire 134 to the mounting member 28, while another type of the second retaining connection 132 may be used to attach the second antenna wire 136 to the mounting member 28. As such, the present invention includes various exemplary embodiments where the different combinations of the first and second retaining connections 130, 132 are employed to connect the first and second antenna wires 134, 136 to the mounting member 28. Further, more than just two antenna wires 134, 136 may be attached to the mounting member 28, causing more than just the two retaining connections 130, 132 to be employed.

The shape of the mounting member 28 which may be at least partially cylindrical, at least partially curved, generally tubular, substantially tubular, completely tubular or cylindrical, or of other configurations may provide for an improved electronics component assembly 10. The aforementioned types of configurations allow for the mounting member 28 to be of a more compact or streamlined design. The mounting member 28 may therefore be of a smaller size and can be more easily incorporated within the tire 12. Additionally, an improved connection between the first and second antenna wires 134, 136 to the mounting member 28 may be effected by a streamlined stress distribution through the mounting member 28. Further, the shape of the mounting member 28 may take up a smaller amount of space and may be more uniform in relation to the shape of the antenna wires 130, 136. This uniformity may be desired in an electronics component assembly 10 since it may reduce the amount of stress concentrations or heat build up within the tire 12 due to the presence of the electronics component assembly 10.

The first and second antenna wires 134, 136 may be constructed out of any material known in the art. For instance, the antenna wires 134, 136 may be made out of copper, aluminum, and/or nickel. Additionally, any number of the antenna wires may be used in accordance with the present invention. For instance, in accordance with one exemplary embodiment of the present invention only the first antenna wire 134 is used in the electronics component assembly 10. Alternatively, three or more antenna wires may be used in other exemplary embodiments.

It should be understood that the present invention includes various modifications that can be made to the electronics component assembly 10 for a tire 12 described herein as come within the scope of the appended claims and their equivalents.

We claim:

1. An electronics component assembly in a tire comprising:
   a mounting member incorporated in the tire, wherein said mounting member is a small outline package that includes means for securing an antenna thereto;
   a first antenna wire incorporated in the tire and connected to said small outline package;
   a second antenna wire incorporated in the tire and connected to said small outline package; and
   an electrical circuit carried by said mounting member and in communication with said first and second antenna wires;
   wherein said means for securing comprises a first and second retaining groove, said first antenna wire is at least partially retained by said first retaining groove, and said second antenna wire is at least partially retained by said second retaining groove.

2. The electronics component assembly of claim 1, wherein said small outline package has a longitudinal axis, and wherein said first and second retaining grooves are perpendicular to said longitudinal axis of said small outline package.

3. The electronics component assembly of claim 1, wherein said small outline package has a longitudinal axis, and wherein said first and second retaining grooves are parallel to said longitudinal axis of said small outline package.

4. The electronics component assembly of claim 1, wherein said second antenna wire is connected to said electrical circuit.

5. An electronics component assembly in a tire, comprising:
   a mounting member incorporated in the tire, wherein said mounting member is a small outline package that includes means for securing an antenna thereto;
   a first antenna wire incorporated in the tire and connected to said small outline package;
   a second antenna wire incorporated in the tire and connected to said small outline package; and
   an electrical circuit carried by said mounting member and in communication with said first and second antenna wires;
   wherein said means for securing comprises a first and second antenna wire receiving aperture, wherein an end of said first antenna wire is hook-shaped and is received by said first antenna receiving aperture, and wherein an end of said second antenna wire is hook-shaped and is received by said second antenna receiving aperture.

6. The electronics component assembly of claim 5, wherein said first and second antenna wires are further connected to said electrical circuit by a connection selected from the group consisting of soldering, welding, and crimping.

7. The electronics component assembly of claim 5, wherein the electrical circuit includes a printed circuit board having a longitudinal axis, and wherein a length of said end of said first antenna wire is connected to said printed circuit board and is oriented parallel to said longitudinal axis, and wherein a length of said end of said second antenna wire is connected to said printed circuit board and is oriented parallel to said longitudinal axis.

8. An electronics component assembly in a tire, comprising:
   a mounting member incorporated in the tire, said mounting member including means for securing an antenna thereto;
   a first antenna wire incorporated in the tire and connected to said mounting member;
   a second antenna wire incorporated in the tire and connected to said mounting member; and
   an electrical circuit carried by said mounting member and in communication with said first and second antenna wires;
   wherein said mounting member has a first side and a second side, said first side located opposite from said second side, and wherein said means for securing comprises a first antenna wire receiving aperture extending from said first side of said mounting member to said second side of said mounting member, and wherein an end of said first antenna wire is received in said first antenna wire receiving aperture,
   wherein said means for securing further comprises a second antenna wire receiving aperture extending from said first side of said mounting member to said second side of said mounting member; and wherein an end of said second antenna wire is received in said second antenna wire receiving aperture.

9. The electronics component assembly of claim 8, further comprising a first wire member connecting said first antenna wire and said electrical circuit.

10. The electronics component assembly of claim 9, further comprising:
    a second wire member connecting said second antenna wire and said electrical circuit.

11. An electronics component assembly in a tire, comprising:
    a tire;
    a mounting member incorporated in the tire, the mounting member having a first side and a second side, the first side opposite from the second side;
    a first antenna wire securely attached to the mounting member, the first antenna wire incorporated in the tire;
    a second antenna wire securely attached to the mounting member, the second antenna wire incorporated in the tire;
    an integrated circuit carried by the mounting member;
    a first communication connection configured for placing the first antenna wire into communication with the integrated circuit; and
    a second communication connection configured for placing the second antenna wire into communication with the integrated circuit;

wherein a length of said first antenna wire extending from the tip of said first antenna wire is connected to said mounting member at a location spaced from the outer edge of said mounting member.

12. The electronics component assembly of claim 11, wherein the mounting member is a small outline package.

13. The electronics component assembly of claim 12, wherein the small outline package has a first and second retaining groove, wherein the first antenna wire is at least partially retained by the first retaining groove, and wherein the second antenna wire is at least partially retained by the second retaining groove.

14. The electronics component assembly of claim 11, wherein the mounting member is a printed circuit board.

15. The electronics component assembly of claim 11, wherein the mounting member has a longitudinal axis, wherein a length of the end of the first antenna wire is securely attached to the mounting member and is oriented perpendicular to the longitudinal axis, and wherein a length of the end of the second antenna wire is securely attached to the mounting member and is oriented perpendicular to the longitudinal axis.

16. The electronics component assembly of claim 11, wherein the first and second antenna wires are securely attached to the mounting member by a secure attachment selected from the group consisting of soldering, welding, and crimping.

17. The electronics component assembly of claim 11, wherein the mounting member has a first antenna wire receiving aperture extending from the first side of the mounting member to the second side of the mounting member, wherein the mounting member has a second antenna wire receiving aperture extending from the first side of the mounting member to the second side of the mounting member, wherein an end of the first antenna wire is received by the first antenna wire receiving aperture, and wherein an end of the second antenna wire is received by the second antenna wire receiving aperture.

18. The electronics component assembly of claim 11, wherein the first communication connection is a first mounting member wire connected to the first antenna wire and the integrated circuit, and wherein the second communication connection is a second mounting member wire connected to the second antenna wire and the integrated circuit.

19. The electronics component assembly of claim 11, wherein the first communication connection is a first bonded connection wherein the first antenna wire is bonded to the integrated circuit; and
wherein the second communication connection is a second bonded connection wherein the second antenna wire is bonded to the integrated circuit.

20. The electronics component assembly of claim 19, wherein the first and second bonded connections are soldered connections.

21. An electronics component assembly in a tire, comprising:
a tire;
a printed circuited board incorporated in the tire, the printed circuit board having a first side and a second side, the first side opposite from the second side, the printed circuit board having a first antenna wire receiving aperture extending from the first side of the printed circuit board to the second side of the printed circuit board, and the printed circuit board having a second antenna wire receiving aperture extending from the first side of the printed circuit board to the second side of the printed circuit board;
a first antenna wire having an end and a bend, the bend in the first antenna wire received by the first antenna wire receiving aperture, and the end of the first antenna wire extending from the first side of the printed circuit board through the first antenna wire receiving aperture and to the second side of the printed circuit board;
a second antenna wire having an end and a bend, the bend of the second antenna wire received by the second antenna wire receiving aperture, and the end of the second antenna wire extending from the first side of the printed circuit board through the second antenna wire receiving aperture and to the second side of the printed circuit board;
an integrated circuit carried by the mounting member;
a first mounting member wire connected to the first antenna wire and the integrated circuit configured for placing the first antenna wire into communication with the integrated circuit; and
a second mounting member wire connected to the second antenna wire and the integrated circuit configured for placing the second antenna wire into communication with the integrated circuit.

22. An electronics component assembly in a tire, comprising:
a mounting member incorporated in the tire and having a first and second retaining connection that are at least partially curved in shape;
a first antenna wire incorporated in the tire and connected to said first retaining connection;
a second antenna wire incorporated in the tire and connected to said second retaining connection; and
an electrical circuit carried by said mounting member and in electrical communication with said first and second antenna wire;
wherein said mounting member includes a flat base and said electrical circuit is attached to said base;
said first retaining connection includes a first and third pair of fingers that are semi-circular in shape and that are attached to said base and engage said first antenna wire to connect said first antenna wire to said mounting member; and
said second retaining connection includes a second and fourth pair of fingers that are semi-circular in shape and are attached to said base and engage said second antenna wire to connect said second antenna wire to said mounting member.

23. An electronics component assembly in a tire comprising:
a mounting member attached to the tire and generally tubular in shape tire and having a first retaining connection that is at least partially tubular in shape;
a first antenna wire incorporated in the tire, and connected to said first retaining connection; and
an electrical circuit carried by said mounting member and in electrical communication with said first antenna wire;
wherein said mounting member has a longitudinal axis, the first retaining connection includes a first angled portion that is defined by a wall of said mounting member and is angled towards said longitudinal axis of said mounting member, and wherein said first antenna wire is connected to said mounting member through engagement with said first angled portion.

24. The electronics component assembly of claim 23, wherein said mounting member includes a first stop that is defined by said wall of said mounting member, and wherein said first antenna wire abuts against the first stop.

25. The electronics component assembly of claim 23, further comprising a first mounting member wire connected to said first antenna wire and said electrical circuit for placing said first antenna wire into electrical communication with said electrical circuit.

26. The electronics component assembly of claim 25, further comprising a cover that protects said electrical circuit and said first mounting member wire.

27. The electronics component assembly of claim 23, further comprising:
a second retaining connection that includes a second angled portion that is defined by said wall of said mounting member and that is angled towards said longitudinal axis of said mounting member, wherein said second antenna wire is connected to said mounting member through engagement with said second angled portion;
and wherein said mounting member includes a second stop that is defined by said wall of said mounting member said second antenna wire abuts against said second stop.

28. The electronics component assembly of claim 27, wherein said first and second angled portions are at an angle of 45 degrees relative to said axis of said mounting member, and wherein said first and second stops are at an angle of 90 degrees relative to said axis of said mounting member.

29. An electronics component assembly in a tire comprising:
mounting member incorporated in the tire and having a first and second retaining connections that are at least partially curved in shape;
first and second antenna wires incorporated in the tire and connected to the first and second retaining connections, respectively; and
an electrical circuit carried by said mounting member and in electrical communication with said first and second antenna wires;
wherein said mounting member defines a longitudinal axis and is generally tubular with a solid central section,
said first retaining connection includes a first angled portion that is a portion of the wall of the mounting member and that is angled towards said axis of said mounting member, said first antenna wire is connected to said mounting member through engagement with said first angled portion, and said first antenna wire abuts against an end of said solid central section; and
said second retaining connection includes a second angled portion that is a portion of the wall of the mounting member and that is angled towards said axis of the mounting member, said second antenna wire is connected to said mounting member through engagement with said second angled portion, and said second antenna wire abuts against an end of said solid central section.

30. The electronics component assembly of claim 29, further comprising:
a first mounting member wire connected to said first antenna wire and said electrical circuit for placing said first antenna wire into electrical communication with said integrated circuit; and
a second mounting member wire connected to said second antenna wire and said electrical circuit for placing said second antenna wire into electrical communication with said integrated circuit.

31. The electronics component assembly of claim 30, further comprising a cover that protects said electrical circuit, said first mounting member wire, and said second mounting member wire.

32. An electronics component assembly in a tire comprising:
a mounting member incorporated in a tire and having a first retaining connection that is at least partially curved in shape;
a first antenna wire incorporated in the tire, and connected to the first retaining connection;
an integrated circuit carried by the mounting member and in electrical communication with the first antenna wire;
a second antenna wire incorporated in the tire; and
wherein the mounting member has a second retaining connection that is at least partially curved in shape, and wherein the second antenna wire is connected to the second retaining connection;
wherein the mounting member is in the shape of a generally solid cylinder, the first retaining connection is a cylindrical cavity that has an annular recess, the second retaining connection is a cylindrical cavity that has an annular recess;
the first antenna wire has an annular projection engageable with the annular recess of the first retaining connection;
the second antenna wire has an annular projection engageable with the annular recess of the second retaining connection;
the first retaining connection is urged around the first antenna wire to help connect the first antenna wire to the mounting member; and
the second retaining connection is urged around the second antenna wire to help connect the second antenna wire to the mounting member.

33. The electronics component assembly of claim 32, further comprising:
a first mounting member wire connected to the first antenna wire and the integrated circuit for placing the first antenna wire into electrical communication with the integrated circuit;
a second mounting member wire connected to the second antenna wire and the integrated circuit for placing the second antenna wire into electrical communication with the integrated circuit; and
wherein the mounting member has a flat portion onto which the integrated circuit is mounted.

34. The electronics component assembly of claim 33, further comprising a cover that protects the integrated circuit, the first mounting member wire, and the second mounting member wire.

35. An electronics component assembly in a tire comprising:
a tire;
a mounting member incorporated in the tire and having a first retaining connection that is at least partially cylindrical in shape, and a second retaining connection that is at least partially cylindrical in shape;
a first antenna wire incorporated in the tire and connected to the first retaining connection;
a second antenna wire incorporated in the tire and connected to the second retaining connection; and
an integrated circuit carried by the mounting member and in electrical communication with the first and second antenna wires;
wherein said first antenna wire is free from contact with said integrated circuit and wherein a length of said first antenna wire is connected to said mounting member at a location spaced from the outer edge of said mounting member.

36. The electronics component assembly of claim 35, wherein:
the mounting member includes a flat base, and the integrated circuit is attached to the base;
the first retaining connection includes a first pair of fingers that are semi-circular in shape and are attached to the base and engage the first antenna wire to connect the first antenna wire to the mounting member; and
the second retaining connection includes a second pair of fingers that are semi-circular in shape and are attached to the base and engage the second antenna wire to connect the second antenna wire to the mounting member.

37. The electronics component assembly of claim 35, wherein the first antenna wire is connected to the first retaining connection and the second antenna wire is connected to the second retaining connection by a connection selected from the group consisting of mechanical fasteners, welding, and adhesion.

38. The electronics component assembly of claim 35, wherein:
the mounting member has an axis and has a solid central section;
the first retaining connection includes a first angled portion that is a portion of the wall of the mounting member that is angled towards the axis of the mounting member, the first antenna wire is connected to the mounting member through engagement with the first angled portion, the first antenna wire abuts an end of the solid central section; and
the second retaining connection includes a second angled portion that is a portion of the wall of the mounting member that is angled towards the axis of the mounting member, the second antenna wire is connected to the mounting member through engagement with the second angled portion, the second antenna wire abuts an end of the solid central section.

39. The electronics component assembly of claim 35, wherein:
the mounting member is in the shape of a generally solid cylinder, the first retaining connection is a cylindrical cavity that has internal threads, the second retaining connection is a cylindrical cavity that has internal threads;
the first antenna wire has external threads that are engageable with the internal threads of the first retaining connection to connect the first antenna wire to the mounting member; and
the second antenna wire has external threads that are engageable with the internal threads of the second retaining connection to connect the second antenna wire to the mounting member.

40. An electronics component assembly of claim 35, wherein:
the mounting member is in the shape of a generally solid cylinder, the first retaining connection is a cylindrical cavity that has an annular recess, the second retaining connection is a cylindrical cavity that has an annular recess;
the first antenna wire has an annular projection engageable with the annular recess of the first retaining connection;
the second antenna wire has an annular projection engageable with the annular recess of the second retaining connection;
the first retaining connection is urged around the first antenna wire to help connect the first antenna wire to the mounting member; and
the second retaining connection is urged around the second antenna wire to help connect the second antenna wire to the mounting member.

41. The electronics component assembly of claim 35, further comprising:
a first mounting member wire connected to the first antenna wire and the integrated circuit for placing the first antenna wire into electrical communication with the integrated circuit;
a second mounting member wire connected to the second antenna wire and the integrated circuit for placing the second antenna wire into electrical communication with the integrated circuit; and
wherein the mounting member has a flat portion onto which the integrated circuit is mounted.

42. The electronics component assembly of claim 35, further comprising a cover that protects the integrated circuit.

43. The electronics component assembly of claim 35, wherein:
the mounting member has an axis and is generally tubular in shape;
the first retaining connection includes a first angled portion that is a portion of the wall of the mounting member that is angled towards the axis of the mounting member, the first antenna wire is connected to the mounting member through engagement with the first angled portion;
the second retaining connection includes a second angled portion that is a portion of the wall of the mounting member that is angled towards the axis of the mounting member, the second antenna wire is connected to the mounting member through engagement with the second angled portion;
the mounting member includes a first stop that is a portion of the wall of the mounting member that is angled towards the axis of the mounting member, the first antenna wire abuts the first stop; and
the mounting member includes a second stop that is a portion of the wall of the mounting member that is angled towards the axis of the mounting member, the second antenna wire abuts the second stop.

44. The electronics component assembly of claim 43, wherein the first and second angled portions are at an angle of 45 degrees towards the axis of the mounting member, and wherein the first and second stops are at an angle of 90 degrees towards the axis of the mounting member.

45. An electronics component assembly in a tire comprising:
a tire;
a mounting member incorporated in the tire, the mounting member is generally tubular in shape with a solid central section and an axis, the mounting member has a flat portion on the solid central section, the mounting member includes a first retaining connection that has a first angled portion that is a portion of the wall of the mounting member that is angled towards the axis of the mounting member, the mounting member includes a second retaining connection that is a second angled portion that is a portion of the wall of the mounting member that is angled towards the axis of the mounting member;

a first antenna wire incorporated in the tire, the first antenna wire is connected to the mounting member through engagement with the first angled portion of the first retaining connection;

a second antenna wire incorporated in the tire, the second antenna wire is connected to the mounting member through engagement with the second angled portion of the second retaining connection;

an integrated circuit mounted on the flat portion of the solid central section of the mounting member;

a first mounting member wire connected to the first antenna wire and the integrated circuit for placing the first antenna wire into electrical communication with the integrated circuit;

a second mounting member wire connected to the second antenna wire and the integrated circuit for placing the second antenna wire into electrical communication with the integrated circuit; and a cover that protects the integrated circuit, the first mounting member wire, and the second mounting member wire.

* * * * *

UNITED STATES PATENT AND TRADEMARK OFFICE
CERTIFICATE OF CORRECTION

| | | |
|---|---|---|
| PATENT NO. | : 7,138,955 B2 | Page 1 of 1 |
| APPLICATION NO. | : 10/692237 | |
| DATED | : November 21, 2006 | |
| INVENTOR(S) | : Kelly et al. | |

It is certified that error appears in the above-identified patent and that said Letters Patent is hereby corrected as shown below:

Column 23, line 30, "mounting member incorporated in the tire and having a" should be --mounting member incorporated in the tire and having--

Signed and Sealed this

Sixth Day of November, 2007

JON W. DUDAS
*Director of the United States Patent and Trademark Office*